(12) United States Patent
Smith et al.

(10) Patent No.: US 12,327,714 B2
(45) Date of Patent: Jun. 10, 2025

(54) PLASMA GENERATION QUALITY MONITORING USING MULTI-CHANNEL SENSOR DATA

(71) Applicant: Applied Materials, Inc., Santa Clara, CA (US)

(72) Inventors: Jeremy Smith, San Mateo, CA (US); Tao Zhang, San Ramon, CA (US); Vivek Bharat Shah, Santa Clara, CA (US); John Poulose, San Jose, CA (US); Ghadeh Hadi, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 18/142,546

(22) Filed: May 2, 2023

(65) Prior Publication Data
US 2024/0371617 A1    Nov. 7, 2024

(51) Int. Cl.
H01J 37/32    (2006.01)
(52) U.S. Cl.
CPC .... H01J 37/3299 (2013.01); H01J 37/32926 (2013.01); H01J 37/32935 (2013.01)
(58) Field of Classification Search
CPC ............. H01J 37/3299; H01J 37/32926; H01J 37/32935
See application file for complete search history.

(56) References Cited

U.S. PATENT DOCUMENTS

| 5,658,423 A | 8/1997 | Angell et al. |
| 10,741,363 B1 | 8/2020 | Burry et al. |

(Continued)

FOREIGN PATENT DOCUMENTS

| CN | 118742993 A | * | 10/2024 | .......... H01J 37/3244 |
| EP | 4358114 A1 | * | 4/2024 | ........ H01J 37/32009 |

(Continued)

OTHER PUBLICATIONS

International Search Report and Written Opinion for International Application No. PCT/US2024/027092, mailed Aug. 20, 2024, 09 pages.

*Primary Examiner* — Adam D Houston
(74) *Attorney, Agent, or Firm* — Lowenstein Sandler LLP

(57) ABSTRACT

A method includes obtaining, by a processing device, a measurement of a calibrated feedback control device of a process chamber. The method further includes determining, by the processing device, a first indication of performance of a plasma generating apparatus of the process chamber based on the measurement of the calibrated feedback control device. The method further includes obtaining, from a first sensor of the process chamber, a second indication of performance of the plasma generating apparatus. The method further include providing the first indication of performance of the plasma generating apparatus and the second indication of performance of the plasma generating apparatus to a plasma monitoring module. The method further includes obtaining, from the plasma monitoring module, a combined indication of performance of the plasma generating apparatus. The method further includes performing, in view of the combined indication of performance of the plasma generating apparatus, a corrective action.

20 Claims, 7 Drawing Sheets

(56) References Cited

U.S. PATENT DOCUMENTS

| | | | |
|---|---|---|---|
| 11,784,028 B2 * | 10/2023 | Zhang | H05H 1/46 |
| | | | 315/111.21 |
| 12,112,107 B2 * | 10/2024 | Shinagawa | G06F 30/33 |
| 2018/0040460 A1 | 2/2018 | Gottscho | |
| 2019/0228950 A1 | 7/2019 | Funk et al. | |
| 2019/0252163 A1 * | 8/2019 | Gottscho | H01J 37/32853 |
| 2021/0327685 A1 | 10/2021 | Chua et al. | |
| 2022/0037134 A1 * | 2/2022 | Fukumoto | C23C 16/52 |
| 2022/0075358 A1 * | 3/2022 | Nagai | H01J 37/32944 |
| 2022/0208520 A1 * | 6/2022 | Zhang | H03H 7/40 |
| 2023/0195061 A1 * | 6/2023 | Gadre | G05B 13/0265 |
| | | | 700/159 |
| 2023/0195078 A1 * | 6/2023 | Zhang | G05B 19/4155 |
| | | | 700/159 |
| 2023/0236586 A1 * | 7/2023 | Cheon | G05B 13/0265 |
| | | | 700/110 |
| 2023/0280736 A1 * | 9/2023 | Cantwell | G05B 23/0281 |
| | | | 700/109 |
| 2023/0306281 A1 * | 9/2023 | Han | H01L 21/67063 |
| 2023/0352284 A1 * | 11/2023 | Turner | H01J 37/32935 |
| 2024/0176334 A1 * | 5/2024 | Bhatia | G05B 19/41885 |
| 2024/0176336 A1 * | 5/2024 | Bhatia | G05B 19/41875 |
| 2024/0203713 A1 * | 6/2024 | Lane | H01J 37/32972 |
| 2024/0288838 A1 * | 8/2024 | Liu | H01L 22/20 |
| 2024/0355592 A1 * | 10/2024 | Nagorny | H01J 37/32568 |
| 2024/0371617 A1 * | 11/2024 | Smith | H01J 37/32972 |

FOREIGN PATENT DOCUMENTS

| | | | | |
|---|---|---|---|---|
| WO | 2018208392 A1 | 11/2018 | | |
| WO | 2021154747 A1 | 8/2021 | | |
| WO | 2022103765 A1 | 5/2022 | | |
| WO | WO-2023086395 A1 * | 5/2023 | | G01N 33/0027 |

* cited by examiner

PLASMA GENERATION QUALITY MONITORING USING MULTI-CHANNEL SENSOR DATA

TECHNICAL FIELD

The present disclosure relates to methods associated with monitoring quality of plasma generation of a process chamber. More particularly, the present disclosure relates to methods associated with monitoring the quality of plasma generation of a process chamber using multi-channel sensor data.

BACKGROUND

Products may be produced by performing one or more manufacturing processes using manufacturing equipment. For example, semiconductor manufacturing equipment may be used to produce substrates via semiconductor manufacturing processes. Products are to be produced with particular properties, suited for a target application. Various models, such as machine learning models, digital twin models, statistical models, empirical models, etc., are utilized to assist in manufacturing processes. Models may be used to monitor processing conditions, monitor product quality, adjust processing conditions, or the like.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular embodiments of the disclosure or any scope of the claims. Its sole purpose is to present some concepts of the disclosure in a simplified form as a prelude to the more detailed description that is presented later.

In one aspect of the present disclosure, a method includes obtaining, by a processing device, a measurement of a calibrated feedback control device of a process chamber. The method further includes determining, by the processing device, a first indication of performance of a plasma generating apparatus of the process chamber based on the measurement of the calibrated feedback control device. The method further includes obtaining, from a first sensor of the process chamber, a second indication of performance of the plasma generating apparatus. The method further includes providing the first indication of performance of the plasma generating apparatus and the second indication of performance of the plasma generating apparatus to a plasma monitoring module. The method further includes obtaining, from the plasma monitoring module, a combined indication of performance of the plasma generating apparatus. The method further includes performing, in view of the combined indication of performance of the plasma generating apparatus, a corrective action.

In another aspect of the present disclosure, a method includes providing, to a trained machine learning model, a first indication of performance of a plasma generating apparatus of a process chamber. The first indication of performance of the plasma generating apparatus is indicative of electrical power delivered to a plasma of the plasma generating apparatus. The method further includes providing, to the trained machine learning model, a second indication of performance of the plasma generating apparatus. The method further includes receiving, from the trained machine learning model, a combined indication of performance of the plasma generating apparatus, based on the first indication of performance and the second indication of performance. The method further includes performing a corrective action in view of the combined indication of performance.

In another aspect of the present disclosure, a non-transitory machine-readable storage medium stores instructions which, when executed, cause a processing device to perform operations. The operations include obtaining, by a processing device, a measurement of a calibrated feedback control device of a process chamber. The operations further include determining, by the processing device, a first indication of performance of a plasma generating apparatus of the process chamber based on the measurement of the calibrated feedback control device. The operations further include obtaining, from a first sensor of the process chamber, a second indication of performance of the plasma generating apparatus. The operations further include providing the first indication of performance of the plasma generating apparatus and the second indication of performance of the plasma generating apparatus to a plasma monitoring module. The operations further include obtaining, from the plasma monitoring module, a combined indication of performance of the plasma generating apparatus. The operations further include performing, in view of the combined indication of performance of the plasma generating apparatus, a corrective action.

BRIEF DESCRIPTION OF THE DRAWINGS

The present disclosure is illustrated by way of example, and not by way of limitation in the figures of the accompanying drawings.

DETAILED DESCRIPTION

Figure 1:
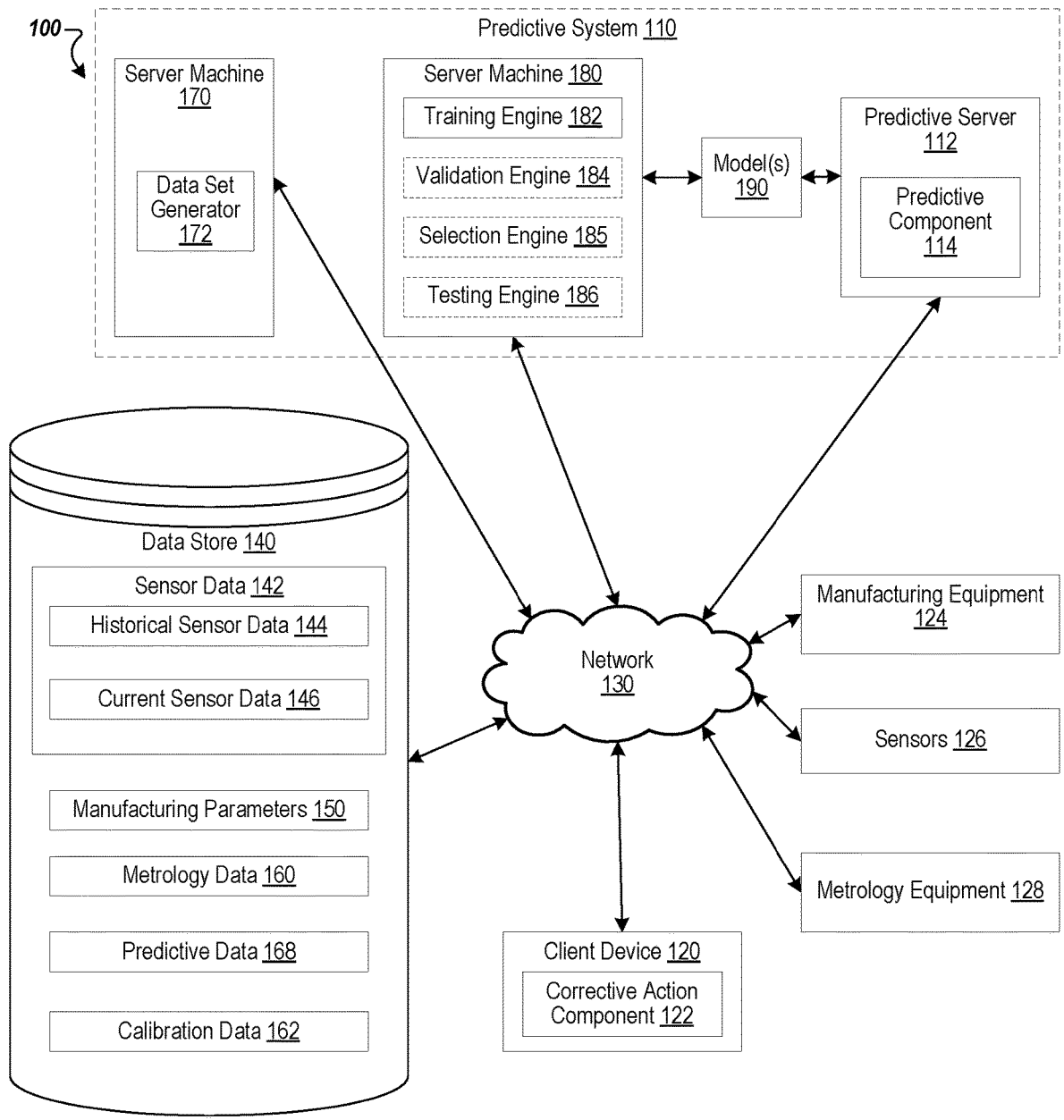
FIG. 1 is a block diagram illustrating an exemplary system architecture, according to some embodiments.

Described herein are technologies related to monitoring performance of a plasma generating system of a process chamber using a digital twin model. Manufacturing equipment is used to produce products, such as substrates (e.g., wafers, semiconductors). Manufacturing equipment may include a manufacturing or processing chamber to separate the substrate from the environment. The properties of produced substrates are to meet target values to facilitate specific functionalities. Manufacturing parameters are selected to produce substrates that meet the target property values. Many manufacturing parameters (e.g., hardware parameters, process parameters, etc.) contribute to the properties of processed substrates. Manufacturing systems may control parameters by specifying a set point for a property value and receiving data from sensors disposed within the manufacturing chamber, and making adjustments to the manufacturing equipment until the sensor readings match the set point. In some embodiments, trained machine learning models are utilized to improve performance of manufacturing equipment.

Some processing procedures include plasma processing operations. Generating plasma may include providing radio frequency (RF) power to one or more electrodes. Generation of large time-varying electric fields strip electrons from atoms of a process gas to generate a plasma for plasma processing operations.

Once initiated, plasma of a process chamber may be stably sustained by continued delivery of RF power to the plasma of the chamber. In some cases, plasma generation may be or become unstable. For example, as plasma generating procedures are started, plasma generation may be initially unstable before finding an equilibrium. As a further example, some process conditions such as inconsistent process gas delivery may interrupt or destabilize an existent plasma in a process chamber.

It may be desirable to monitor the condition and/or quality of plasma in a process chamber. It may be desirable to adjust a process operation based on observed quality of plasma in a process chamber.

In some systems, plasma quality may be monitored by a spectrometer, tuned to measure wavelengths of radiation expected to be emitted by active plasma. In some systems, plasma quality may be monitored by monitoring RF power reflected by a plasma generating apparatus. Each of these plasma monitoring techniques has shortcomings. A given amount of plasma emission measured by a spectrometer may not definitively determine whether or not plasma generation is stable. Similarly, a given amount of reflected power may not definitively determine whether or not plasma generation is stable.

Methods and systems of the present disclosure may address one or more shortcomings of conventional methods. A digital twin model of a plasma generation system may be generated. The digital twin may include a simplified circuit diagram of the plasma generation system. The digital twin may abstract electrical effects of a number of components related to a plasma generation apparatus.

The plasma generation system may include one or more adjustable components. The plasma generation system may include one or more static components (e.g., components with fixed electrical properties). The plasma generation system may include one or more capacitors with adjustable capacitances. In some embodiments, adjustable components may be included in a feedback system. Adjustable components may be automatically adjusted by the feedback system. The feedback system may be configured to adjust one or more adjustable components of the plasma generation system to adjust power delivered to a plasma of the process chamber. The feedback system may be configured to adjust one or more adjustable components of the plasma generation system to maximize delivery of power to the plasma.

Properties of the components of the plasma generation system may be calibrated using the digital twin model. Parameters of the adjustable components (e.g., capacitances of adjustable capacitors) may be monitored. Parameters of the adjustable components of the plasma generation system may be monitored as the plasma generation system is operated in varying operating conditions. Gas pressure, gas mix, RF power, temperature, and other variables effecting plasma generation may be altered in calibration operations. A calibrated digital twin of the plasma generation system may be generated by calibrating actual responses of components of the plasma generation system while under a variety of plasma generation conditions. In some embodiments, details of an abstracted plasma generation apparatus or plasma generation component may be determined by additional calibration efforts, such as providing RF power without striking a plasma.

Output of the digital twin model may be utilized in monitoring plasma generation. Further data may be combined with output of the digital twin model in determining a quality of plasma generated in the process chamber. For example, digital twin plasma generation output may be combined with spectrometer data and/or power reflection data in determining whether or not a plasma generating system is generating acceptable plasma. Digital twin plasma generation may be combined with one or more other data in determining a likelihood of a plasma fault (e.g., for performance of fault detection).

Methods and systems of the present disclosure provide technical advantages over conventional solutions. A calibrated digital twin model may enable determination of power delivered to the plasma of a process chamber. Determination of power delivery may be performed by reading output of existing monitoring tools. Determination of power delivery may be performed by reading output of calibrated electrical components. Determination of power delivery may be performed without performing voltage and/or current measurements, which may be difficult to perform accurately at relevant powers and frequencies. A measurement indicative of power dispersed in the plasma enables determination of plasma quality. Increased accuracy and/or reliability may be achieved by including one or more additional indicators of plasma generation. Increased accuracy of plasma quality determination may be achieved by further includes spectrometric measurements and/or power reflection measurements. Increased accuracy of a likelihood of plasma fault determination may be achieved by combining digital twin output with spectrometric measurements and/or power reflection measurements. Increased accuracy of a likelihood of plasma fault determination may be achieved by providing multiple indications of plasma performance to a regressive model. Increased accuracy of a plasma fault determination may be achieved by providing multiple indications of plasma performance to a logistic model. Increased accuracy of a plasma fault determination may be achieved by providing multiple indications of plasma performance to a trained machine learning model.

Improving accuracy of a determination of quality of a plasma improves operation of a process system. By receiving an accurate determination of quality of plasma, improvements may be made to a processing recipe. Improved processing recipes may conserve processing time, improve processing throughput, reduce processing energy consumption, reduce processing material consumption, reduce processing environmental impact, etc. By receiving an accurate determination of quality of plasma, adjustments may be made to a live processing operation. Adjustments may improve process operation outcomes. Adjustment may increase a portion of successful process procedures, decrease cost associated with discarding defective products, decrease cost of diagnosing defects and root causes of defects, etc. By receiving an accurate determination of quality of plasma, health of a process system may be monitored. Quality of plasma generation may indicate health of one or more components of a plasma generation system. By assessing health of the plasma generation system, maintenance may be more appropriately scheduled, component replacement may be planned for, costs associated with unplanned downtime (including lost productivity, rushed repairs, rush shipping for replacement components, etc.) may be mitigated. By receiving an accurate determination of quality of plasma over time, aging or failing components of a plasma generating system may be monitored. By receiving an accurate determination of quality of plasma, an unproductive processing procedure may be aborted, conserving time, energy, materials, and environmental impact of continuing to execute the process recipe.

Improving accuracy of a determination of quality of plasma may reduce a risk of a malfunctioning or poorly operating plasma system damaging components of a processing system. For example, under some conditions abnormally behaving plasma may indicate arcing, overloading one or more components, or the like. By assessing a quality of plasma generation a performing a corrective action in view of the quality of plasma generation, damage to one or more components of a substrate processing system may be prevented or mitigated, costs associated with maintenance and replacement components may be reduced, unplanned downtime may be reduced, proportion of substrates with acceptable qualities may be increased, unwanted arcing in the process chamber may be reduced, etc.

In one aspect of the present disclosure, a method includes obtaining, by a processing device, a measurement of a calibrated feedback control device of a process chamber. The method further includes determining, by the processing device, a first indication of performance of a plasma generating apparatus of the process chamber based on the measurement of the calibrated feedback control device. The method further includes obtaining, from a first sensor of the process chamber, a second indication of performance of the plasma generating apparatus. The method further includes providing the first indication of performance of the plasma generating apparatus and the second indication of performance of the plasma generating apparatus to a plasma monitoring module. The method further includes obtaining, from the plasma monitoring module, a combined indication of performance of the plasma generating apparatus. The method further includes performing, in view of the combined indication of performance of the plasma generating apparatus, a corrective action.

In another aspect of the present disclosure, a method includes providing, to a trained machine learning model, a first indication of performance of a plasma generating apparatus of a process chamber. The first indication of performance of the plasma generating apparatus is indicative of electrical power delivered to a plasma of the plasma generating apparatus. The method further includes providing, to the trained machine learning model, a second indication of performance of the plasma generating apparatus. The method further includes receiving, from the trained machine learning model, a combined indication of performance of the plasma generating apparatus, based on the first indication of performance and the second indication of performance. The method further includes performing a corrective action in view of the combined indication of performance.

In another aspect of the present disclosure, a non-transitory machine-readable storage medium stores instructions which, when executed, cause a processing device to perform operations. The operations include obtaining, by a processing device, a measurement of a calibrated feedback control device of a process chamber. The operations further include determining, by the processing device, a first indication of performance of a plasma generating apparatus of the process chamber based on the measurement of the calibrated feedback control device. The operations further include obtaining, from a first sensor of the process chamber, a second indication of performance of the plasma generating apparatus. The operations further include providing the first indication of performance of the plasma generating apparatus and the second indication of performance of the plasma generating apparatus to a plasma monitoring module. The operations further include obtaining, from the plasma monitoring module, a combined indication of performance of the plasma generating apparatus. The operations further include performing, in view of the combined indication of performance of the plasma generating apparatus, a corrective action.

FIG. 1 is a block diagram illustrating an exemplary system 100 (exemplary system architecture), according to some embodiments. The system 100 includes a client device 120, manufacturing equipment 124, sensors 126, metrology equipment 128, predictive server 112, and data store 140. The predictive server 112 may be part of predictive system 110. Predictive system 110 may further include server machines 170 and 180.

Sensors 126 may provide sensor data 142 associated with manufacturing equipment 124 (e.g., associated with producing, by manufacturing equipment 124, corresponding products, such as substrates). Sensor data 142 may be used to ascertain equipment health and/or product health (e.g., product quality). Manufacturing equipment 124 may produce products following a recipe or performing runs over a period of time. In some embodiments, sensor data 142 may include values of one or more of optical sensor data, spectral data, temperature (e.g., heater temperature), spacing (SP), pressure, High Frequency Radio Frequency (HFRF), radio frequency (RF) match voltage, RF match current, RF match capacitor position, voltage of Electrostatic Chuck (ESC), actuator position, electrical current, flow, power, voltage, etc. Sensor data 142 may include historical sensor data 144 and current sensor data 146. Current sensor data 146 may be associated with a product currently being processed, a product recently processed, a number of recently processed products, etc. Current sensor data 146 may be used as input to a trained machine learning model, e.g., to generate predictive data 168. Historical sensor data 144 may include data stored associated with previously produced products. Historical sensor data 144 may include data associated with previous recipes performed by manufacturing equipment 124. Historical sensor data 144 may include data associated with calibration operations. Historical sensor data 144 may include sensor data associated with operations performed to calibrate a digital twin model. Historical sensor data 144 may be used to train a digital twin model, e.g., model 190. Historical sensor data 144 may be used to train a machine learning model, e.g., model 190. Historical sensor data 144 and/or current sensor data 146 may include attribute data, e.g., labels of manufacturing equipment ID or design, sensor ID, type, and/or location, label of a state of manufacturing equipment, such as a present fault, service lifetime, etc.

Sensor data 142 may be associated with or indicative of manufacturing parameters such as hardware parameters of manufacturing equipment 124 or process parameters of manufacturing equipment 124. Hardware parameters may include hardware settings, identification, size, and type of installed components, etc. Process parameters may include heater settings, gas flow settings, RF settings, etc. Data associated with some hardware parameters and/or process parameters may, instead or additionally, be stored as manufacturing parameters 150, which may include historical manufacturing parameters (e.g., associated with historical processing runs) and current manufacturing parameters. Manufacturing parameters 150 may be indicative of input settings to the manufacturing device (e.g., heater power, gas flow, etc.). Sensor data 142 and/or manufacturing parameters 150 may be provided while the manufacturing equipment 124 is performing manufacturing processes (e.g., equipment readings while processing products). Sensor data 142 may be different for each product (e.g., each substrate). Substrates may have property values (film thickness, film strain, etc.) measured by metrology equipment 128, e.g., measured at a standalone metrology facility. Metrology data 160 may be a component of data store 140. Metrology data 160 may include historical metrology data (e.g., metrology data associated with previously processed products).

In some embodiments, metrology data 160 may be provided without use of a standalone metrology facility. For example, metrology data 160 may include in-situ metrology data, metrology or a proxy for metrology collected during processing. Metrology data 160 may include integrated metrology data, metrology or a proxy for metrology collected while a product is within a chamber or under vacuum, but not during processing operations. Metrology data 160 may include inline metrology data, data collected after a substrate is removed from vacuum. Metrology data 160 may include further types of metrology data from further types of metrology generation techniques. Metrology data 160 may include current metrology data (e.g., metrology data associated with a product currently or recently processed).

In some embodiments, sensor data 142, metrology data 160, or manufacturing parameters 150 may be processed (e.g., by the client device 120 and/or by the predictive server 112). Processing of the sensor data 142 may include generating features. In some embodiments, the features are a pattern in the sensor data 142, metrology data 160, and/or manufacturing parameters 150 (e.g., slope, width, height, peak, etc.). In some embodiments, features include combinations of values from the sensor data 142, metrology data, and/or manufacturing parameters (e.g., power derived from voltage and current, etc.). Sensor data 142 may include features and the features may be used by predictive component 114 for performing signal processing and/or for obtaining predictive data 168 for performance of a corrective action.

Each instance (e.g., set) of sensor data 142 may correspond to a product (e.g., a substrate), a set of manufacturing equipment, a calibration procedure, a type of substrate produced by manufacturing equipment, or the like. Each instance of metrology data 160 and manufacturing parameters 150 may likewise correspond to a product, a set of manufacturing equipment, a type of substrate produced by manufacturing equipment, or the like. The data store may further store information associating sets of different data types, e.g., information indicative that a set of sensor data, a set of metrology data, and a set of manufacturing parameters are all associated with the same product, manufacturing equipment, calibration procedure, type of substrate, etc.

In some embodiments, predictive system 110 may generate predictive data 168 using supervised machine learning. Predictive data 168 may include output from a machine learning model that was trained using labeled data, such as sensor data labeled with plasma quality data. In some embodiments, predictive system 110 may generate predictive data 168 using unsupervised machine learning. Predictive data 168 may include output from a machine learning model that was trained using unlabeled data. Output of an unsupervised machine learning model may include clustering results, principle component analysis, anomaly detection, etc. In some embodiments, predictive system 110 may generate predictive data 168 using semi-supervised learning (e.g., training data may include a mix of labeled and unlabeled data.

Data store 140 further includes calibration data 162. Calibration data may be data associated with calibrating a digital twin model for use in generating predictive data 168. Calibration data 162 may be data associated with calibration and/or operation of a physics-based model for use in generating predictive data 168. Calibration data 162 may include calculated values of characteristics of components. Calibration data 162 may include corrected values of nominal characteristics of components of a plasma generation system. Calibration data 162 may include tables, curves, surfaces, etc., of parameters of components dependent upon one or more variables, such as temperature, power delivery, voltage splitting, etc. Calibration data 162 may include data for operating a digital twin model for determining predictive data 168.

Client device 120, manufacturing equipment 124, sensors 126, metrology equipment 128, predictive server 112, data store 140, server machine 170, and server machine 180 may be coupled to each other via network 130 for generating predictive data 168 to perform corrective actions. In some embodiments, network 130 may provide access to cloud-based services. Operations performed by client device 120, predictive system 110, data store 140, etc., may be performed by virtual cloud-based devices.

In some embodiments, network 130 is a public network that provides client device 120 with access to the predictive server 112, data store 140, and other publicly available computing devices. In some embodiments, network 130 is a private network that provides client device 120 access to manufacturing equipment 124, sensors 126, metrology equipment 128, data store 140, and other privately available computing devices. Network 130 may include one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

Client device 120 may include computing devices such as Personal Computers (PCs), laptops, mobile phones, smart phones, tablet computers, netbook computers, network connected televisions ("smart TV"), network-connected media players (e.g., Blu-ray player), a set-top-box, Over-the-Top (OTT) streaming devices, operator boxes, etc. Client device 120 may include a corrective action component 122. Corrective action component 122 may receive user input (e.g., via a Graphical User Interface (GUI) displayed via the client device 120) of an indication associated with manufacturing equipment 124. In some embodiments, corrective action component 122 transmits the indication to the predictive system 110, receives output (e.g., predictive data 168) from the predictive system 110, determines a corrective action based on the output, and causes the corrective action to be implemented. In some embodiments, corrective action component 122 obtains sensor data 142 (e.g., current sensor data 146) associated with manufacturing equipment 124 (e.g., from data store 140, etc.) and provides sensor data 142 (e.g., current sensor data 146) associated with the manufacturing equipment 124 to predictive system 110.

In some embodiments, corrective action component 122 may retrieve sensor data associated with feedback components of a plasma generation system. Corrective action component 122 may provide the sensor data to predictive system 110. Corrective action component 122 may receive output from predictive system 110 indicative of quality of plasma generated by manufacturing equipment 124. Corrective action component 122 may perform a corrective action based on the output from predictive system 110.

In some embodiments, corrective action component 122 receives an indication of a corrective action from the predictive system 110 and causes the corrective action to be implemented. Each client device 120 may include an operating system that allows users to one or more of generate, view, or edit data. Client device 120 may provide an indication associated with manufacturing equipment 124, corrective actions associated with manufacturing equipment 124, etc. Client device 120 may provide a graphical user interface for providing indications of predictive data 168 to a user, to receive instructions from the user, etc.

In some embodiments, metrology data 160 corresponds to historical property data of products and predictive data 168 is associated with predicted property data based on a quality of plasma generation. In some embodiments, predictive data 168 is or includes predicted metrology data of the products to be produced or that have been produced according to conditions recorded as current sensor data 146, current measurement data, current metrology data and/or current manufacturing parameters. In some embodiments, predictive data 168 is or includes an indication of any abnormalities (e.g., abnormal products, abnormal components, abnormal manufacturing equipment 124, abnormal energy usage, etc.) and optionally one or more causes of the abnormalities. In some embodiments, predictive data 168 is an indication of change over time or drift in some component of manufacturing equipment 124, sensors 126, metrology equipment 128, and the like. In some embodiments, predictive data 168 is an indication of an end of life of a component of manufacturing equipment 124, sensors 126, metrology equipment 128, or the like. In some embodiments, predictive data 168 is an indication of progress of a processing operation being performed, e.g., to be used for process control.

Performing manufacturing processes that result in defective products can be costly in time, energy, products, components, manufacturing equipment 124, the cost of identifying the defects and discarding the defective product, etc. By inputting sensor data 142 (e.g., sensor data indicative of plasma quality) into predictive system 110, receiving output of predictive data 168, and performing a corrective action based on the predictive data 168, system 100 can have the technical advantage of avoiding the cost of producing, identifying, and discarding defective products.

Performing manufacturing processes that result in failure of the components of the manufacturing equipment 124 can be costly in downtime, damage to products, damage to equipment, express ordering replacement components, etc. By inputting sensor data 142 (e.g., manufacturing parameters that are being used or are to be used to manufacture a product), metrology data, measurement data, etc., receiving output of predictive data 168, and performing corrective action (e.g., predicted operational maintenance, such as replacement, processing, cleaning, etc. of components) based on the predictive data 168, system 100 can have the technical advantage of avoiding the cost of one or more of unexpected component failure, unscheduled downtime, productivity loss, unexpected equipment failure, product scrap, or the like. Monitoring the performance over time of components, e.g. manufacturing equipment 124, sensors 126, metrology equipment 128, and the like, may provide indications of degrading components.

Manufacturing parameters may be suboptimal for producing product which may have costly results of increased resource (e.g., energy, coolant, gases, etc.) consumption, increased amount of time to produce the products, increased component failure, increased amounts of defective products, etc. By inputting sensor data to predictive system 110, receiving an indication of plasma quality, and adjusting a process operation based on the indication of plasma quality, the manufacturing system may have the benefit of increasing optimization of manufacturing parameters for processing a target product.

Performing manufacturing operations with suboptimal plasma generation may increase an environmental impact of processing procedures. Environmental impact may be increased by increasing processing time, which increases energy expenditure, material expenditure, etc. Environmental impact may be impacted by increasing a likelihood of generating defective products, increasing waste, resources dedicated to disposing of defective products, etc. By providing sensor data to predictive system 110, receiving indications of plasma quality, and performing corrective actions based on the plasma quality, manufacturing system 100 may benefit from the technical advantage of reduction of environmental impact in substrate processing operations.

Corrective actions may be associated with one or more of Computational Process Control (CPC), Statistical Process Control (SPC) (e.g., SPC on electronic components to determine process in control, SPC to predict useful lifespan of components, SPC to compare to a graph of 3-sigma, etc.), Advanced Process Control (APC), model-based process control, preventative operative maintenance, design optimization, updating of manufacturing parameters, updating manufacturing recipes, feedback control, machine learning modification, or the like.

In some embodiments, the corrective action includes providing an alert to a user. The alert may be an alarm to stop or not perform the manufacturing process if the predictive data 168 indicates a predicted abnormality, such as an abnormality of the product, a component, a plasma generation system, or manufacturing equipment 124. In some embodiments, a machine learning model is trained to monitor the progress of a processing run (e.g., monitor in-situ sensor data to predict if a manufacturing process is proceeding as expected). In some embodiments, the machine learning model may send instructions to end a processing run when the model determines that the process is complete. In some embodiments, the corrective action includes providing feedback control (e.g., modifying a manufacturing parameter responsive to the predictive data 168 indicating a predicted abnormality). In some embodiments, performance of the corrective action includes causing updates to one or more manufacturing parameters. In some embodiments, performance of a corrective action may include retraining a machine learning model associated with manufacturing equipment 124. In some embodiments, performance of a corrective action may include training a new machine learning model associated with manufacturing equipment 124.

Manufacturing parameters 150 may include hardware parameters (e.g., information indicative of which components are installed in manufacturing equipment 124, indicative of component replacements, indicative of component age, indicative of software version or updates, etc.) and/or process parameters (e.g., temperature, pressure, flow, rate, electrical current, voltage, gas flow, lift speed, etc.). In some embodiments, the corrective action includes causing preventative operative maintenance (e.g., replace, process, clean, etc. components of the manufacturing equipment 124). In some embodiments, the corrective action includes causing design optimization (e.g., updating manufacturing parameters, manufacturing processes, manufacturing equipment 124, etc. for an optimized product). In some embodiments, the corrective action includes a updating a recipe (e.g., altering the timing of manufacturing subsystems entering an idle or active mode, altering set points of various property values, etc.).

Predictive server 112, server machine 170, and server machine 180 may each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc. Operations of predictive server 112, server machine 170, server machine 180, data store 140, etc., may be performed by a cloud computing service, cloud data storage service, etc.

Predictive server 112 may include a predictive component 114. In some embodiments, the predictive component 114 may receive current sensor data 146, and/or current manufacturing parameters (e.g., receive from the client device 120, retrieve from the data store 140) and generate output (e.g., predictive data 168) for performing corrective action associated with the manufacturing equipment 124 based on the current data. In some embodiments, predictive data 168 may include one or more predicted dimension measurements of a processed product. In some embodiments, predictive component 114 may use one or more trained machine learning models and/or digital twin models 190 to determine the output for performing the corrective action based on current data.

Manufacturing equipment 124 may be associated with one or more machine leaning models, e.g., model 190. Machine learning models associated with manufacturing equipment 124 may perform many tasks, including process control, classification, performance predictions, etc. Model 190 may be trained using data associated with manufacturing equipment 124 or products processed by manufacturing equipment 124, e.g., sensor data 142 (e.g., collected by sensors 126), manufacturing parameters 150 (e.g., associated with process control of manufacturing equipment 124), metrology data 160 (e.g., generated by metrology equipment 128), etc.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs).

A recurrent neural network (RNN) is another type of machine learning model. A recurrent neural network model is designed to interpret a series of inputs where inputs are intrinsically related to one another, e.g., time trace data, sequential data, etc. Output of a perceptron of an RNN is fed back into the perceptron as input, to generate the next output.

Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In an image recognition application, for example, the raw input may be a matrix of pixels; the first representational layer may abstract the pixels and encode edges; the second layer may compose and encode arrangements of edges; the third layer may encode higher level shapes (e.g., teeth, lips, gums, etc.); and the fourth layer may recognize a scanning role. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Another type of machine learning model that may be used in connection with manufacturing system 100 is a support vector machine (SVM). A SVM performs classification of inputs into categories of interest. A SVM may determine a complex decision boundary between classification categories. A SVM may be provided sensor data associated with manufacturing equipment 124 and determine whether plasma generation is normal or abnormal based on labelled training data.

In some embodiments, predictive component 114 receives current sensor data 146, performs signal processing to break down the current data into sets of current data, provides the sets of current data as input to a trained model 190, and obtains outputs indicative of predictive data 168 from the trained model 190.

In some embodiments, the various models discussed in connection with model 190 (e.g., supervised machine learning model, unsupervised machine learning model, physics-based model, digital twin model, etc.) may be combined in one model (e.g., an ensemble model), or may be separate models.

Data may be passed back and forth between several distinct models included in model(s) 190 and predictive component 114. In some embodiments, some or all of these operations may instead be performed by a different device, e.g., client device 120, server machine 170, server machine 180, etc. It will be understood by one of ordinary skill in the art that variations in data flow, which components perform which processes, which models are provided with which data, and the like are within the scope of this disclosure.

Data store 140 may be a memory (e.g., random access memory), a drive (e.g., a hard drive, a flash drive), a database system, a cloud-accessible memory system, or another type of component or device capable of storing data. Data store 140 may include multiple storage components (e.g., multiple drives or multiple databases) that may span multiple computing devices (e.g., multiple server computers). The data store 140 may store sensor data 142, manufacturing parameters 150, metrology data 160, calibration data 162, and predictive data 168.

Sensor data 142 may include historical sensor data 144 and current sensor data 146. Sensor data may include sensor data time traces over the duration of manufacturing processes, associations of data with physical sensors, preprocessed data, such as averages and composite data, and data indicative of sensor performance over time (e.g., many manufacturing processes). Manufacturing parameters 150 and metrology data 160 may contain similar features, e.g., historical metrology data and current metrology data. Historical sensor data 144, historical metrology data, and historical manufacturing parameters may be historical data (e.g., at least a portion of these data may be used for training model(s) 190). Current sensor data 146, current metrology data, and current manufacturing parameters may be current data (e.g., at least a portion to be input into learning model 190, subsequent to the historical data) for which predictive data 168 is to be generated (e.g., for performing corrective actions).

In some embodiments, predictive system 110 further includes server machine 170 and server machine 180. Server machine 170 includes a data set generator 172 that is capable of generating data sets (e.g., a set of data inputs and a set of target outputs) to train, validate, and/or test model(s) 190, including one or more machine learning models. Some operations of data set generator 172 are described in detail below with respect to FIGS. 2 and 4A. In some embodiments, data set generator 172 may partition the historical data (e.g., historical sensor data 144, historical manufacturing parameters, historical metrology data) into a training set (e.g., sixty percent of the historical data), a validating set (e.g., twenty percent of the historical data), and a testing set (e.g., twenty percent of the historical data).

In some embodiments, predictive system 110 (e.g., via predictive component 114) generates multiple sets of features. For example a first set of features may correspond to a first set of types of sensor data (e.g., from a first set of sensors, first combination of values from first set of sensors, first patterns in the values from the first set of sensors) that correspond to each of the data sets (e.g., training set, validation set, and testing set). A second set of features may correspond to a second set of types of sensor data (e.g., from a second set of sensors different from the first set of sensors, second combination of values different from the first combination, second patterns different from the first patterns) that correspond to each of the data sets.

In some embodiments, machine learning model 190 is provided historical data as training data. In some embodiments, a digital twin model 190 may be provided calibration data 162 or sensor data associated with calibration procedures as training/calibration data. The historical and/or calibration data may be or include data indicative of performance of a plasma generation system. The type of data provided will vary depending on the intended use of the machine learning model. For example, a machine learning model may be trained by providing the model with historical sensor data 144 as training input and corresponding metrology data 160 as target output. In some embodiments, a large volume of data is used to train model 190, e.g., sensor and metrology data of hundreds of substrates may be used. In some embodiments, a fairly small volume of data is available to train model 190, e.g., model 190 is to be trained to recognize a rare event such as equipment failure, model 190 is to be trained to generate predictions of a newly seasoned or maintained chamber, etc.

Server machine 180 includes a training engine 182, a validation engine 184, selection engine 185, and/or a testing engine 186. An engine (e.g., training engine 182, a validation engine 184, selection engine 185, and a testing engine 186) may refer to hardware, software, firmware, microcode, or a combination thereof. Hardware solutions may include circuitry, dedicated logic, programmable logic, microcode, processing devices, etc. Software solution may include instructions run on a processing device, a general purpose computer system, or a dedicated machine. The training engine 182 may be capable of training a model 190 using one or more sets of features associated with the training set from data set generator 172. The training engine 182 may generate multiple trained models 190, where each trained model 190 corresponds to a distinct set of features of the training set (e.g., sensor data from a distinct set of sensors). For example, a first trained model may have been trained using all features (e.g., X1-X5), a second trained model may have been trained using a first subset of the features (e.g., X1, X2, X4), and a third trained model may have been trained using a second subset of the features (e.g., X1, X3, X4, and X5) that may partially overlap the first subset of features. Data set generator 172 may receive the output of a trained model (e.g., synthetic data 162 from synthetic data generator 174), collect that data into training, validation, and testing data sets, and use the data sets to train a second model (e.g., a machine learning model configured to output predictive data, corrective actions, etc.).

Validation engine 184 may be capable of validating a trained model 190 using a corresponding set of features of the validation set from data set generator 172. For example, a first trained machine learning model 190 that was trained using a first set of features of the training set may be validated using the first set of features of the validation set. The validation engine 184 may determine an accuracy of each of the trained models 190 based on the corresponding sets of features of the validation set. Validation engine 184 may discard trained models 190 that have an accuracy that does not meet a threshold accuracy. In some embodiments, selection engine 185 may be capable of selecting one or more trained models 190 that have an accuracy that meets a threshold accuracy. In some embodiments, selection engine 185 may be capable of selecting the trained model 190 that has the highest accuracy of the trained models 190.

Testing engine 186 may be capable of testing a trained model 190 using a corresponding set of features of a testing set from data set generator 172. For example, a first trained machine learning model 190 that was trained using a first set of features of the training set may be tested using the first set of features of the testing set. Testing engine 186 may determine a trained model 190 that has the highest accuracy of all of the trained models based on the testing sets.

In the case of a machine learning model, model 190 may refer to the model artifact that is created by training engine 182 using a training set that includes data inputs and corresponding target outputs (correct answers for respective training inputs). Patterns in the data sets can be found that map the data input to the target output (the correct answer), and machine learning model 190 is provided mappings that capture these patterns. The machine learning model 190 may use one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network, recurrent neural network), etc.

In some embodiments, one or more machine learning models 190 may be trained using historical data (e.g., historical sensor data 144). In some embodiments, models 190 may have been trained using calibration data 162, sensor data associated with a calibration procedure, or a combination of historical data and calibration data.

Predictive component 114 may provide current data to model 190 and may run model 190 on the input to obtain one or more outputs. For example, predictive component 114 may provide current sensor data 146 to model 190 and may run model 190 on the input to obtain one or more outputs. Predictive component 114 may be capable of determining (e.g., extracting) predictive data 168 from the output of model 190. Predictive component 114 may determine (e.g., extract) confidence data from the output that indicates a level of confidence that predictive data 168 is an accurate predictor of a process associated with the input data for products produced or to be produced using the manufacturing equipment 124 at the current sensor data 146 and/or current manufacturing parameters. Predictive component 114 or corrective action component 122 may use the confidence data to decide whether to cause a corrective action associated with the manufacturing equipment 124 based on predictive data 168.

The confidence data may include or indicate a level of confidence that the predictive data 168 is an accurate prediction for products or components associated with at least a portion of the input data. In one example, the level of confidence is a real number between 0 and 1 inclusive, where 0 indicates no confidence that the predictive data 168 is an accurate prediction for products processed according to input data or component health of components of manufacturing equipment 124 and 1 indicates absolute confidence that the predictive data 168 accurately predicts properties of products processed according to input data or component health of components of manufacturing equipment 124. Responsive to the confidence data indicating a level of confidence below a threshold level for a predetermined number of instances (e.g., percentage of instances, frequency of instances, total number of instances, etc.) predictive component 114 may cause trained model 190 to be re-trained (e.g., based on current sensor data 146, current manufacturing parameters, etc.). In some embodiments, retraining may include generating one or more data sets (e.g., via data set generator 172) utilizing historical data and/or synthetic data.

For purpose of illustration, rather than limitation, aspects of the disclosure describe the training of one or more machine learning models 190 using historical data (e.g., historical sensor data 144, historical manufacturing parameters) and inputting current data (e.g., current sensor data 146, current manufacturing parameters, and current metrology data) into the one or more trained machine learning models to determine predictive data 168. In other embodiments, a heuristic model, physics-based model, or rule-based model is used to determine predictive data 168 (e.g., without using a trained machine learning model). In some embodiments, such models may be trained using historical data. In some embodiments, these models may be retrained utilizing historical data. Predictive component 114 may monitor historical sensor data 144, historical manufacturing parameters, and metrology data 160. Any of the information described with respect to data inputs 210 of FIG. 2 may be monitored or otherwise used in the heuristic, physics-based, or rule-based model.

In some embodiments, the functions of client device 120, predictive server 112, server machine 170, and server machine 180 may be provided by a fewer number of machines. For example, in some embodiments server machines 170 and 180 may be integrated into a single machine, while in some other embodiments, server machine 170, server machine 180, and predictive server 112 may be integrated into a single machine. In some embodiments, client device 120 and predictive server 112 may be integrated into a single machine. In some embodiments, functions of client device 120, predictive server 112, server machine 170, server machine 180, and data store 140 may be performed by a cloud-based service.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 may determine the corrective action based on the predictive data 168. In another example, client device 120 may determine the predictive data 168 based on output from the trained machine learning model.

In addition, the functions of a particular component can be performed by different or multiple components operating together. One or more of the predictive server 112, server machine 170, or server machine 180 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Embodiments of the disclosure may be applied to data quality evaluation, feature enhancement, model evaluation, Virtual Metrology (VM), Predictive Maintenance (PdM), limit optimization, process control, or the like.

Figure 2:
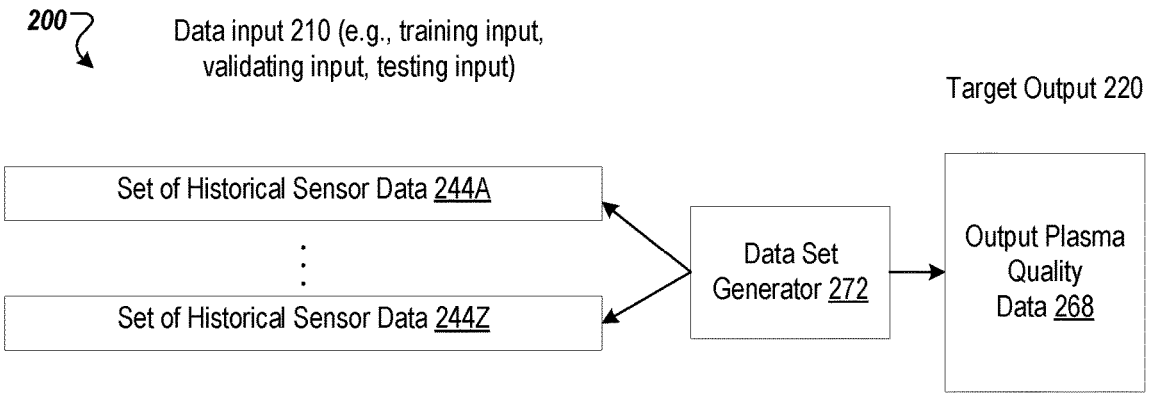
FIG. 2 depicts a block diagram of a system including an example data set generator for creating data sets for one or more supervised models, according to some embodiments.

FIG. 2 depicts a block diagram of a system 200 including an example data set generator 272 (e.g., data set generator 172 of FIG. 1) to create data sets for training, testing, validating, etc. a model (e.g., model 190 of FIG. 1), according to some embodiments. A data set generator may be utilized for creating data sets for a model, or for multiple models. Each model used may have a dedicated data set generator, or multiple models may share a data set generator. Each data set generator 272 may be part of server machine 170 of FIG. 1. In some embodiments, several machine learning models associated with manufacturing equipment 124 may be trained, used, and maintained (e.g., within a manufacturing facility). Each machine learning model may be associated with one data set generator 272, multiple machine learning models may share a data set generator 272, etc.

FIG. 2 depicts a system 200 including data set generator 272 for creating data sets for one or more supervised models (e.g., model 190 of FIG. 1). Data set generator 272 may create data sets (e.g., data input 210, target output 220) using historical data and/or calibration data. In some embodiments, a data set generator similar to data set generator 272 may be utilized to train an unsupervised machine learning model, e.g., target output 220 may not be generated by data set generator 272. An unsupervised model may be used for anomaly detection, outlier detection, clustering, etc. An unsupervised model may be used for data associated with a plasma generation system, e.g., for determining outliers that merit further investigation.

Data set generator 272 may generate data sets to train, test, and validate a model. In some embodiments, data set generator 272 may generate data sets for a machine learning model. In some embodiments, data set generator 272 may generate data sets for training, testing, and/or validating a model configured to classify plasma generation operations as normal or abnormal. The machine learning model is provided with set of historical sensor data 244A as data input 210A. The machine learning model may be configured to accept sensor data as input data and generate plasma quality classification data as output.

Sets of input sensor data may include various data types indicative of plasma quality. Input sensor data may include output of sensors associated with operation of a plasma feedback system, such as adjustable capacitor positions of the plasma generation system. Input sensor data may include output of a digital twin model of a plasma feedback system, e.g., indicating power delivered to the plasma generated by the plasma generation system. Input sensor data may include electromagnetic (e.g., optical) emission data collected from a plasma generation region of a process chamber. Input sensor data may include data from an optical emission spectrometer. Input sensor data may include measured plasma emission by an optical sensor. Input sensor data may include an indication of reflected power of the plasma generation system. Input sensor data may include an indication on electrical power reflected from the plasma generating apparatus. Reflected power may be caused by an impedance mismatch between a plasma generation apparatus (e.g., plasma coil) and one or more other components of the plasma generation system.

Data set generator 272 may be used to generate data for any type of machine learning model that takes as input sensor data. Data set generator 272 may be used to generate data for a machine learning model that generates anomaly predictions of a substrate based on plasma generation quality. Data set generator 272 may be used to generate data for a machine learning model that recommends corrective actions based on plasma generation quality. Data set generator 272 may be used with a model that generates predicted metrology data of a substrate. Data set generator 272 may be used to generate data for a machine learning model configured to provide process control instructions, such as modifying plasma generation procedures or aborting a plasma processing operation if the plasma generation process meets some threshold fault criteria. Data set generator 272 may be used to generate data for a machine learning model configured to identify a product anomaly and/or processing equipment fault.

In some embodiments, data set generator 272 generates a data set (e.g., training set, validating set, testing set) that includes one or more data inputs 210 (e.g., training input, validating input, testing input). Data inputs 210 may be provided to training engine 182, validating engine 184, or testing engine 186. The data set may be used to train, validate, or test the model (e.g., model 190 of FIG. 1).

In some embodiments, data input 210 may include one or more sets of data. As an example, system 200 may produce sets of sensor data that may include one or more of sensor data from one or more types of sensors, combinations of sensor data from one or more types of sensors, patterns from sensor data from one or more types of sensors, and/or synthetic versions thereof.

In some embodiments, data set generator 272 may generate a first data input corresponding to a first set of historical sensor data 244A to train, validate, or test a first machine learning model. Data set generator 272 may generate a second data input corresponding to a second set of historical sensor data 244B to train, validate, or test a second machine learning model. Data set generator 272 may use further sets of historical sensor data 244C, . . . 244Z for training, validating, and/or testing further machine learning models.

In some embodiments, data set generator 272 generates a data set (e.g., training set, validating set, testing set) that includes one or more data inputs 210 (e.g., training input, validating input, testing input) and may include one or more target outputs 220 that correspond to the data inputs 210. The data set may also include mapping data that maps the data inputs 210 to the target outputs 220. In some embodiments, data set generator 272 may generate data for training a machine learning model configured to output a classification of plasma generation quality, by generating data sets including output plasma quality data 268. Data set generator 272 may generate data sets including plasma generating apparatus performance classification data as target output. Data inputs 210 may also be referred to as "features," "attributes," "feature vectors," or "information." In some embodiments, data set generator 272 may provide the data set to training engine 182, validating engine 184, or testing engine 186, where the data set is used to train, validate, or test the machine learning model (e.g., one of the machine learning models that are included in model 190, ensemble model 190, etc.).

Data inputs 210 to train, validate, or test a machine learning model may include information for a particular manufacturing chamber (e.g., for particular substrate manufacturing equipment). In some embodiments, data inputs 210 may include information for a specific type of manufacturing equipment, e.g., manufacturing equipment sharing specific characteristics. Data inputs 210 may include data associated with a device of a certain type, e.g., intended function, design, produced with a particular recipe, etc. Training a machine learning model based on a type of equipment, device, recipe, etc. may allow the trained model to generate predictive data in a number of settings (e.g., for a number of different facilities, products, etc.).

In some embodiments, subsequent to generating a data set and training, validating, or testing a machine learning model using the data set, the model may be further trained, validated, or tested, or adjusted (e.g., adjusting weights or parameters associated with input data of the model, such as connection weights in a neural network).

In some embodiments, a similar approach using a data set generator may be utilized for training/calibrating a digital twin model, physics-based model, or the like. In some embodiments, calibration data for a digital twin is obtained by performing one or more experimental procedures. For example, plasma may be generated at a variety of combinations of process conditions. The model may be calibrated utilizing data from the experimental/calibration operations. The digital twin model may include a circuit diagram, and attributes of the circuit diagram may be calibrated based on the calibration procedures.

Figure 3:
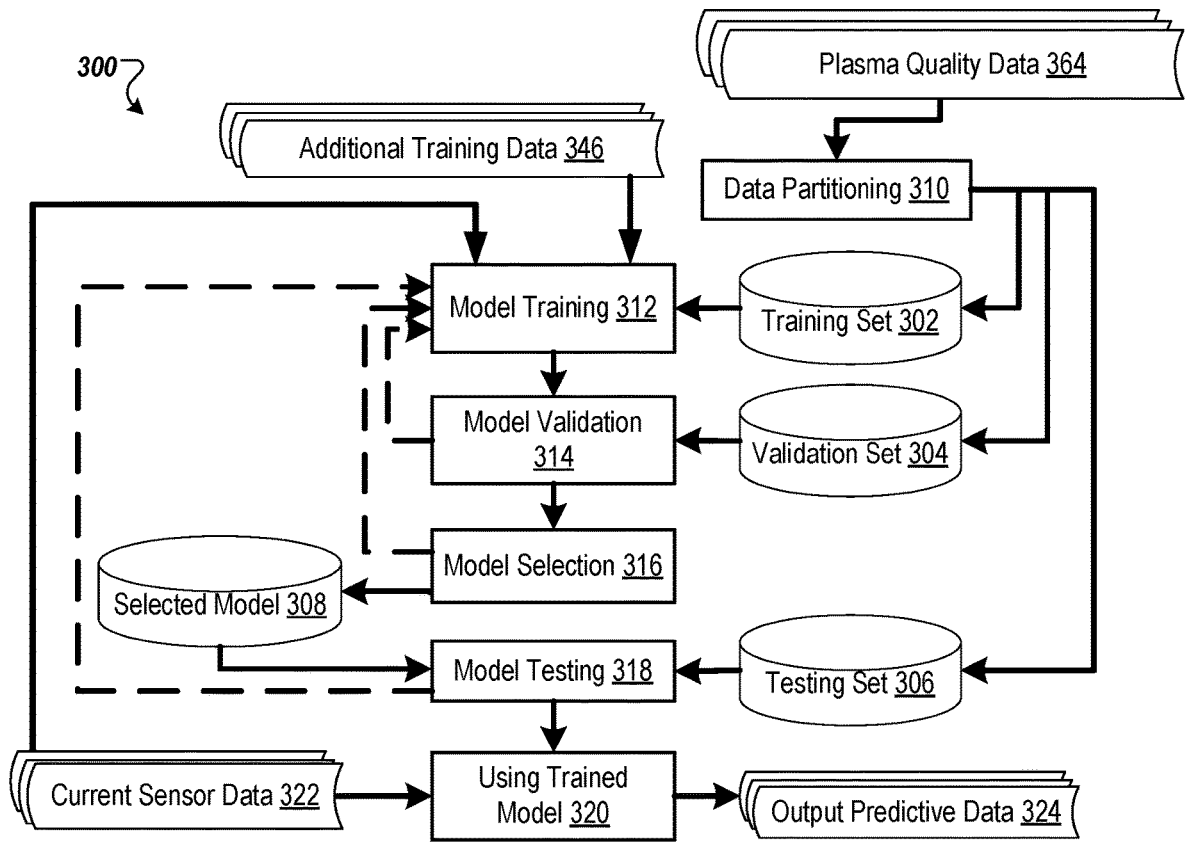
FIG. 3 is a block diagram illustrating a system for generating output data, according to some embodiments.

FIG. 3 is a block diagram illustrating system 300 for generating output predictive data (e.g., predictive data 168 of FIG. 1), according to some embodiments. System 300 may be used in conjunction with a machine learning model configured to generate data indicating quality of plasma generation (e.g., via model 190 of FIG. 1). In some embodiments, system 300 may be used in conjunction with a machine learning model to determine a corrective action associated with manufacturing equipment. In some embodiments, system 300 may be used in conjunction with a machine learning model to determine a fault of manufacturing equipment. In some embodiments, system 300 may be used in conjunction with a machine learning model to cluster or classify substrates. System 300 may be used in conjunction with a machine learning model with a different function than those listed, associated with a manufacturing system.

At block 310, system 300 performs data partitioning of data to be used in training, validating, and/or testing a machine learning model. System 300 may include components of predictive system 110 of FIG. 1. Data partitioning may be performed via data set generator 172 of FIG. 1. In some embodiments, plasma quality data 364 includes historical data, such as historical sensor data indicative of plasma generation, historical plasma quality data, historical classification data (e.g., classification of whether a plasma meets performance thresholds), etc. Plasma quality data 364 may undergo data partitioning at block 310 to generate training set 302, validation set 304, and testing set 306. For example, the training set may be 60% of the training data, the validation set may be 20% of the training data, and the testing set may be 20% of the training data.

The generation of training set 302, validation set 304, and testing set 306 may be tailored for a particular application. For example, the training set may be 60% of the training data, the validation set may be 20% of the training data, and the testing set may be 20% of the training data. System 300 may generate a plurality of sets of features for each of the training set, the validation set, and the testing set. For example, if plasma quality data 364 includes sensor data, including features derived from sensor data from 20 sensors (e.g., sensors 126 of FIG. 1), the sensor data may be divided into a first set of features including sensors 1-10 and a second set of features including sensors 11-20. Either target input, target output, both, or neither may be divided into sets. Multiple models may be trained on different sets of data.

At block 312, system 300 performs model training (e.g., via training engine 182 of FIG. 1) using training set 302. Training of a machine learning model and/or of a physics-based model (e.g., a digital twin) may be achieved in a supervised learning manner, which involves providing a training dataset including labeled inputs through the model, observing its outputs, defining an error (by measuring the difference between the outputs and the label values), and using techniques such as deep gradient descent and back-propagation to tune the weights of the model such that the error is minimized. In many applications, repeating this process across the many labeled inputs in the training dataset yields a model that can produce correct output when presented with inputs that are different than the ones present in the training dataset. In some embodiments, training of a machine learning model may be achieved in an unsupervised manner, e.g., labels or classifications may not be supplied during training. An unsupervised model may be configured to perform anomaly detection, result clustering, etc.

For each training data item in the training dataset, the training data item may be input into the model (e.g., into the machine learning model). The model may then process the input training data item (e.g., a number of measured dimensions of a manufactured device, a cartoon picture of a manufactured device, etc.) to generate an output. The output may include, for example, predicted plasma generation quality data. The output may be compared to a label of the training data item (e.g., a label applied to the data by a subject matter expert).

Processing logic may then compare the generated output to the label that was included in the training data item. Processing logic determines an error (i.e., a classification error) based on the differences between the output and the label(s). Processing logic adjusts one or more weights and/or values of the model based on the error.

In the case of training a neural network, an error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

System 300 may train multiple models using multiple sets of features of the training set 302 (e.g., a first set of features of the training set 302, a second set of features of the training set 302, etc.). For example, system 300 may train a model to generate a first trained model using the first set of features in the training set (e.g., sensor data from sensors 1-10). System 300 may further train a model to generate a second trained model using the second set of features in the training set (e.g., sensor data from sensors 11-20). In some embodiments, the first trained model and the second trained model may be combined to generate a third trained model (e.g., which may be a better predictor or synthetic data generator than the first or the second trained model on its own). In some embodiments, sets of features used in comparing models may overlap (e.g., first set of features being sensor data from sensors 1-15 and second set of features being sensors 5-20). In some embodiments, hundreds of models may be generated including models with various permutations of features and combinations of models.

At block 314, system 300 performs model validation (e.g., via validation engine 184 of FIG. 1) using the validation set 304. The system 300 may validate each of the trained models using a corresponding set of features of the validation set 304. For example, system 300 may validate the first trained model using the first set of features in the validation set (e.g., sensor data from sensors 1-10) and the second trained model using the second set of features in the validation set (e.g., sensor data from sensors 11-20). In some embodiments, system 300 may validate hundreds of models (e.g., models with various permutations of features, combinations of models, etc.) generated at block 312. At block 314, system 300 may determine an accuracy of each of the one or more trained models (e.g., via model validation) and may determine whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. System 300 may discard the trained models that have an accuracy that is below the threshold accuracy (e.g., based on the validation set).

At block 316, system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow may return to block 312 where the system 300 performs model training using further refined training sets corresponding to further refined sets of features for determining a trained model that has the highest accuracy.

At block 318, system 300 performs model testing (e.g., via testing engine 186 of FIG. 1) using testing set 306 to test selected model 308. System 300 may test, using the first set of features in the testing set (e.g., sensor data from sensors 1-10), the first trained model to determine the first trained model meets a threshold accuracy (e.g., based on the first set of features of the testing set 306). Responsive to accuracy of the selected model 308 not meeting the threshold accuracy, flow continues to block 312 where system 300 performs model training (e.g., retraining) using different training sets corresponding to different sets of features (e.g., sensor data from different sensors). Accuracy of selected model 308 not meeting a threshold accuracy may indicate that the selected model 308 is overly fit to the training set 302 and/or validation set 304. Accuracy of selected model 308 not meeting a threshold accuracy may indicate that the selected model 308 is not applicable to other data sets. Responsive to determining that selected model 308 has an accuracy that meets a threshold accuracy based on testing set 306, flow continues to block 320. In at least block 312, the model may learn patterns in the training data to make predictions or generate synthetic data, and in block 318, the system 300 may apply the model on the remaining data (e.g., testing set 306) to test the predictions.

At block 320, system 300 uses the trained model (e.g., selected model 308) to receive current sensor data 322 and determines (e.g., extracts), from the output of the trained model, output predictive data 324. Current sensor data 322 may include data of one or more adjustable components of a plasma generation feedback system. Current sensor data 322 may include output of a digital twin model that is provided adjustable component data as input. Current sensor data 322 may include optical emission data, reflected power data, etc. A corrective action associated with the manufacturing equipment 124 of FIG. 1 may be performed in view of output predictive data 324. In some embodiments, current sensor data 322 may correspond to the same types of features in the historical data used to train the machine learning model. In some embodiments, current sensor data 322 corresponds to a subset of the types of features in historical data that are used to train selected model 308 (e.g., a machine learning model may be trained using a number of sensor measurements, and configured to generate output based on a subset of sensor measurements).

In some embodiments, the performance of a machine learning model trained, validated, and tested by system 300 may deteriorate. For example, a manufacturing system associated with the trained machine learning model may undergo a gradual change or a sudden change. A change in the manufacturing system may result in decreased performance of the trained machine learning model. A new model may be generated to replace the machine learning model with decreased performance. The new model may be generated by altering the old model by retraining, by generating a new model, etc.

Alteration of the trained machine learning model may include providing current sensor data 322 for model training/retraining at block 312. Alteration of the trained machine learning model may include providing additional training data 346 for training/retraining at block 312. Additional training data may include classification labels associated with the current sensor data 322, additional sensor data and additional corresponding classification labels, etc.

In some embodiments, one or more of the acts 310-320 may occur in various orders and/or with other acts not presented and described herein. In some embodiments, one or more of acts 310-320 may not be performed. For example, in some embodiments, one or more of data partitioning of block 310, model validation of block 314, model selection of block 316, or model testing of block 318 may not be performed.

FIG. 3 depicts a system configured for training, validating, testing, and using one or more machine learning models. The machine learning models are configured to accept data as input (e.g., set points provided to manufacturing equipment, sensor data, metrology data, etc.) and provide data as output (e.g., predictive data, corrective action data, classification data, etc.). Partitioning, training, validating, selection, testing, and using blocks of system 300 may be executed similarly to train a second model, utilizing different types of data. Retraining may also be done, utilizing current sensor data 322 and/or additional training data 346.

Figure 4A:
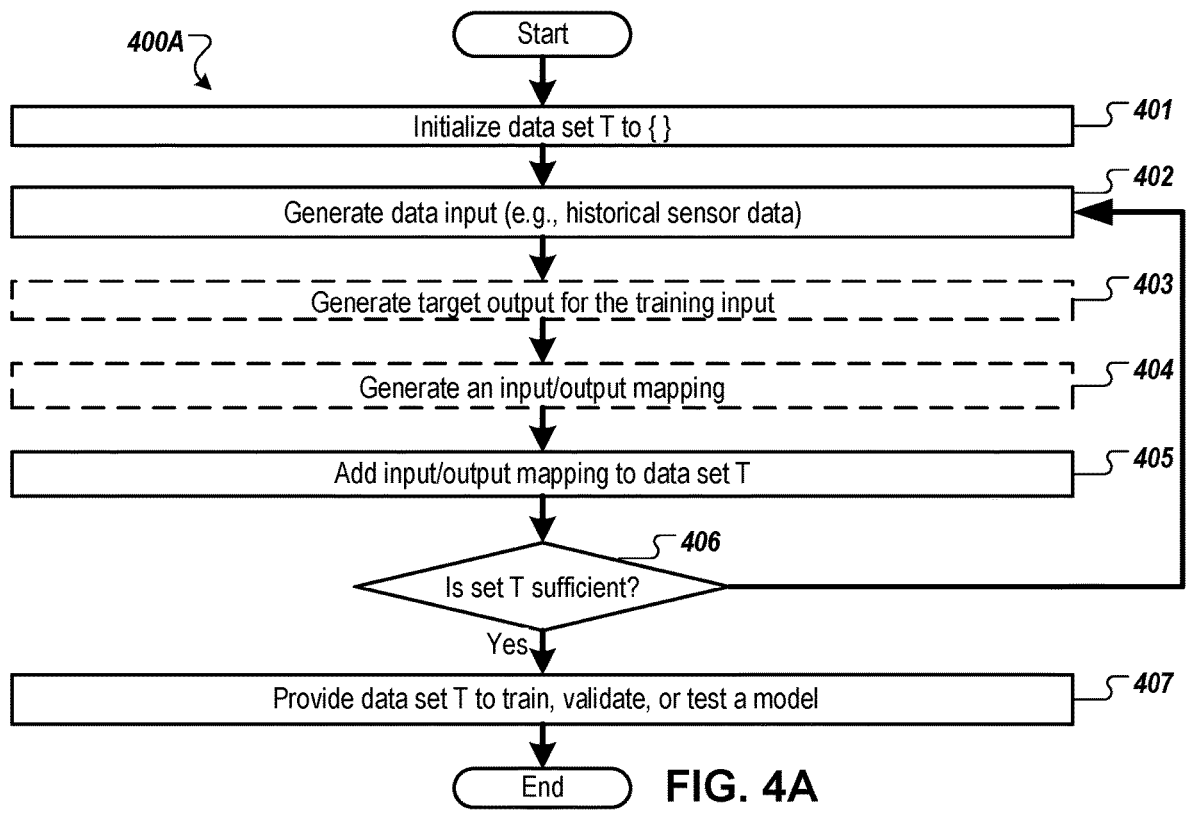
FIG. 4A is a flow diagram of a method for generating a data set for a machine learning model, according to some embodiments.
Figure 4B:
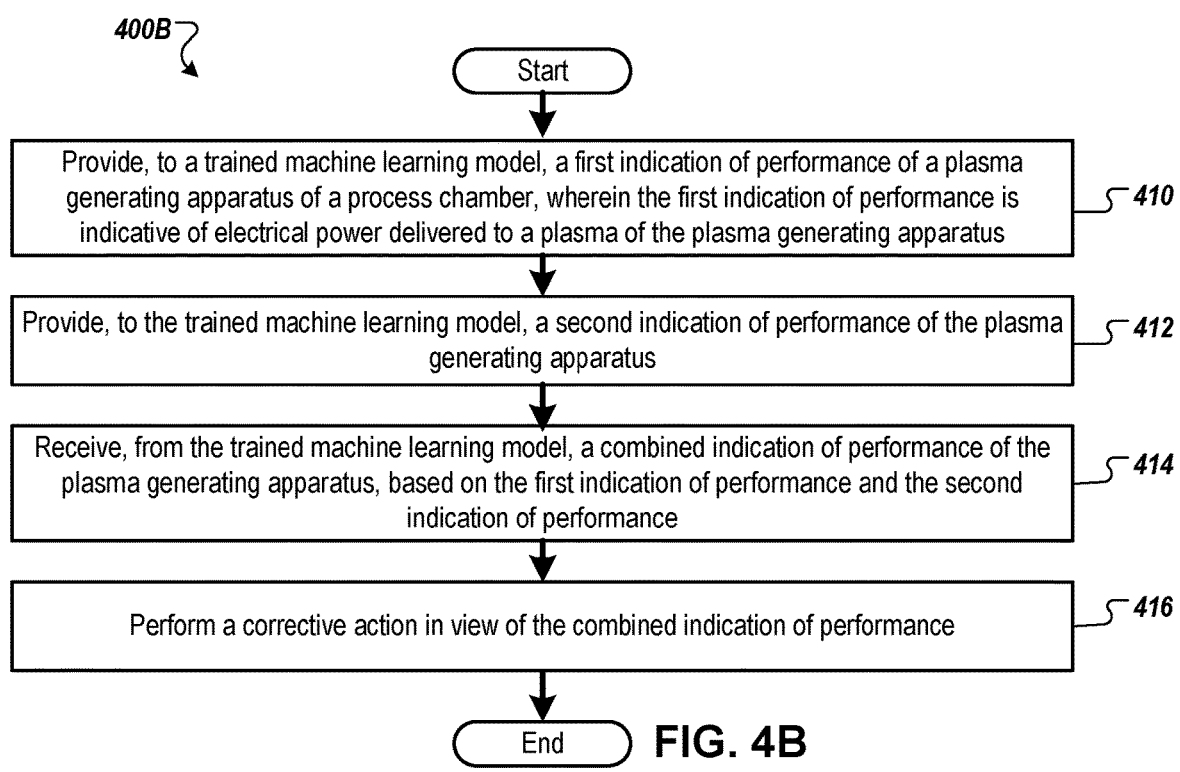
FIG. 4B is a flow diagram of a method for utilizing a trained machine learning model for determining plasma generation quality, according to some embodiments.
Figure 4C:
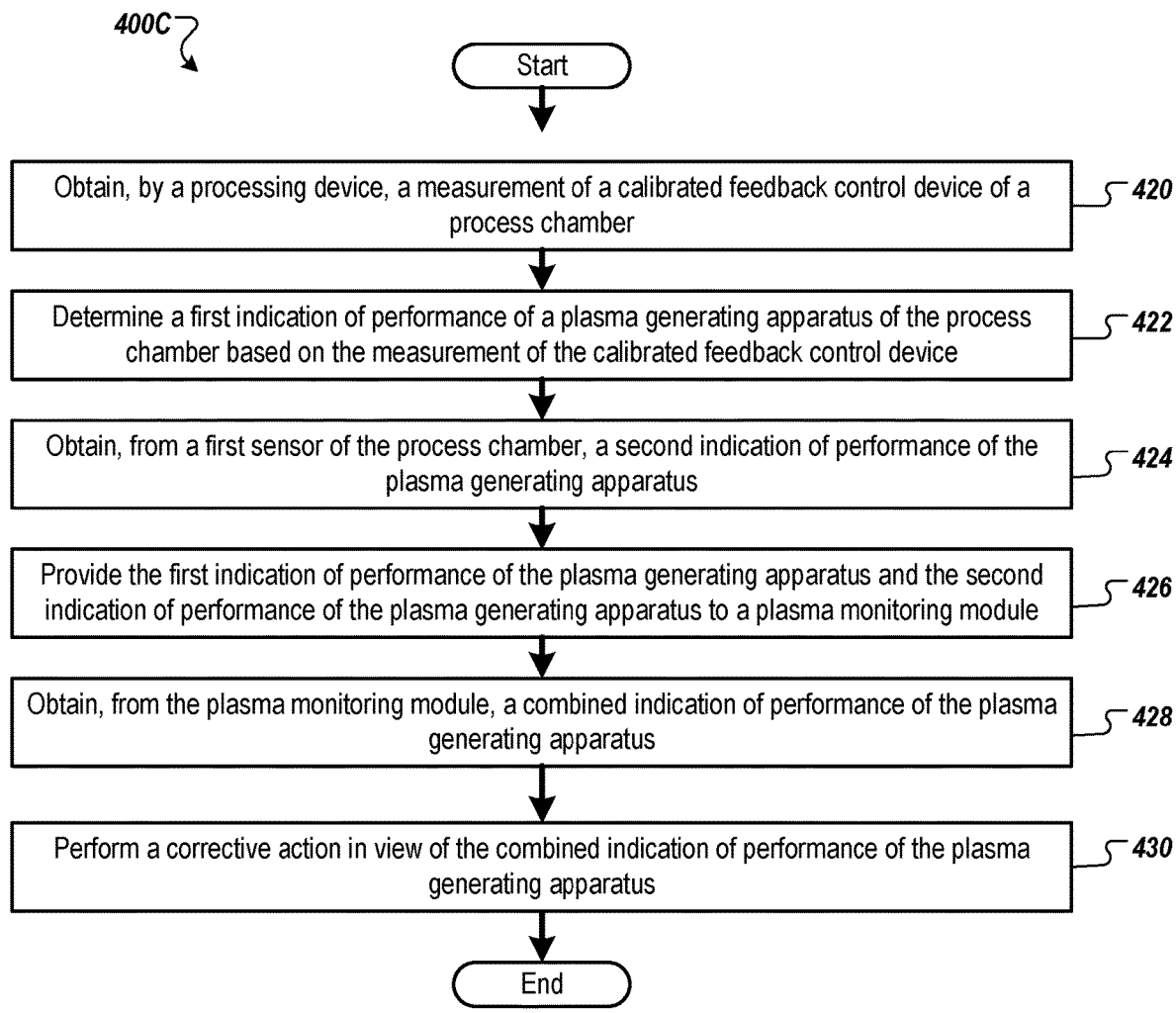
FIG. 4C is a flow diagram of a method for performing a corrective action associated with plasma generation of a process chamber, according to some embodiments.

FIGS. 4A-C are flow diagrams of methods 400A-C associated with determining and/or monitoring plasma generation quality, according to some embodiments. Methods 400A-C may include training and utilizing machine learning models, according to some embodiments. Methods 400A-C may be performed by processing logic that may include hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiment, methods 400A-C may be performed, in part, by predictive system 110. Method 400A may be performed, in part, by predictive system 110 (e.g., server machine 170 and data set generator 172 of FIG. 1, data set generator 272 of FIG. 2). Predictive system 110 may use method 400A to generate a data set to at least one of train, validate, or test a machine learning model, in accordance with embodiments of the disclosure. Methods 400B-C may be performed by predictive server 112 (e.g., predictive component 114) and/or server machine 180 (e.g., training, validating, and testing operations may be performed by server machine 180). Methods 400B-C may be performed by client device 120, corrective action component 122, etc. In some embodiments, a non-transitory machine-readable storage medium stores instructions that when executed by a processing device (e.g., of predictive system 110, of server machine 180, of predictive server 112, etc.) cause the processing device to perform one or more of methods 400A-C.

For simplicity of explanation, methods 400A-C are depicted and described as a series of operations. However, operations in accordance with this disclosure can occur in various orders and/or concurrently and with other operations not presented and described herein. Furthermore, not all illustrated operations may be performed to implement methods 400A-C in accordance with the disclosed subject matter. In addition, those skilled in the art will understand and appreciate that methods 400A-C could alternatively be represented as a series of interrelated states via a state diagram or events.

FIG. 4A is a flow diagram of a method 400A for generating a data set for a machine learning model, according to some embodiments. Referring to FIG. 4A, in some embodiments, at block 401 the processing logic implementing method 400A initializes a training set T to an empty set.

At block 402, processing logic generates first data input (e.g., first training input, first validating input) that may include one or more of sensor, manufacturing parameters, metrology data, etc. In some embodiments, the first data input may include a first set of features for types of data and a second data input may include a second set of features for types of data (e.g., as described with respect to FIG. 3). Input data may include historical data. Input data may be associated with plasma generation quality. Input data may include output of a digital twin model of a plasma generation system. Input data may include sensor data associated with plasma generation, such as reflected power values, plasma spectral data, etc.

In some embodiments, at block 403, processing logic optionally generates a first target output for one or more of the data inputs (e.g., first data input). In some embodiments, the input includes one or more sensor measurements and the target output is an indication of plasma quality. In some embodiments, the input includes one or more sensor channels and the target output includes a recommended corrective action. In some embodiments, the first target output is predictive data. In some embodiments, input data may be in the form of sensor data and target output may be a list of components likely to be faulty, as in the case of a machine learning model configured to identify failing manufacturing systems. In some embodiments, input may include sensor data indicative of plasma quality and output may include a predicted likelihood that plasma generation is satisfying a target threshold condition. In some embodiments, output may include a likelihood that the plasma generation is meeting one or more threshold performance standards. In some embodiments, no target output is generated (e.g., an unsupervised machine learning model capable of grouping or finding correlations in input data, rather than requiring target output to be provided).

At block 404, processing logic optionally generates mapping data that is indicative of an input/output mapping. The input/output mapping (or mapping data) may refer to the data input (e.g., one or more of the data inputs described herein), the target output for the data input, and an association between the data input(s) and the target output. In some embodiments, such as in association with machine learning models where no target output is provided, block 404 may not be executed.

At block 405, processing logic adds the mapping data generated at block 404 to data set T, in some embodiments.

At block 406, processing logic branches based on whether data set T is sufficient for at least one of training, validating, and/or testing a machine learning model, such as model 190 of FIG. 1. If so, execution proceeds to block 407, otherwise, execution continues back at block 402. It should be noted that in some embodiments, the sufficiency of data set T may be determined based simply on the number of inputs, mapped in some embodiments to outputs, in the data set, while in some other embodiments, the sufficiency of data set T may be determined based on one or more other criteria (e.g., a measure of diversity of the data examples, accuracy, etc.) in addition to, or instead of, the number of inputs.

At block 407, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210A) are input to the neural network, and output values (e.g., numerical values associated with target outputs 220A) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 407, a model (e.g., model 190) can be at least one of trained using training engine 182 of server machine 180, validated using validating engine 184 of server machine 180, or tested using testing engine 186 of server machine 180. The trained model may be implemented by predictive component 114 (of predictive server 112) to generate predictive data 168 for performing signal processing, or for performing a corrective action associated with manufacturing equipment 124.

FIG. 4B is a flow diagram of a method 400B for utilizing a trained machine learning model for determining plasma generation quality, according to some embodiments. At block 410 of method 400B, processing logic provides a first indication of performance of a plasma generating apparatus of a process chamber to a trained machine learning model. The trained machine learning model may be of any type or architecture appropriate for classification. The trained machine learning model may be a support vector machine. The first indication of performance is indicative of electrical power delivered to a plasma generated by the plasma generating apparatus. The first indication of performance may be generated by providing one or more inputs to a digital twin model of the plasma generating system associated with the plasma generating apparatus.

The first indication of performance may be associated with power delivered to a plasma. The first indication of performance may be associated with resistance to current associated with the plasma. Generating the first indication of performance may include providing one or more indications of performance of a plasma generation system to a digital twin model. Generating the first indication of performance may include providing properties of one or more adjustable components of a plasma generation system to a digital twin model. Generating the first indication of performance may include providing data of properties of a plasma feedback system to a digital twin model. Generating the first indication of performance may include providing measured plasma generation feedback data (e.g., data measured from a plasma generation feedback system) to a digital twin model. Generating the first indication of performance may include providing capacitances of one or more adjustable capacitors to a digital twin model. Generating the first indication of performance may include comparing properties determined using a circuit model to calibration properties, such as properties of a plasma generation apparatus under conditions where plasma is not generated.

At block 412, processing logic provides a second indication of performance of the plasma generating apparatus to the trained machine learning model. The second indication of performance may include a separate input channel than the first indication of performance. The second indication of performance may be selected to provide complementary information to the first indication of performance. The second indication of performance may be spectral data associated with plasma emission. The second indication of performance may include optical emission data of the plasma collected by an optical sensor. The second indication of performance may be reflected power of a plasma generation system. In some embodiments, three or more indications of performance of the plasma generating apparatus may be provided to the trained machine learning model.

At block 414, processing logic receives a combined indication of performance of the plasma generating apparatus from the trained machine learning model. The combined indication of performance is based on the first indication of performance and the second indication of performance. The combined indication of performance may be output of the trained machine learning model. The combined indication of performance may be a classification, e.g., normal plasma, abnormal plasma, critically abnormal plasma, etc. The combined indication of performance may be a score, e.g., a score indicative of plasma quality. The combined indication of performance may be a likelihood that plasma generation satisfies one or more threshold conditions, e.g., a likelihood that plasma generation is normal, a likelihood that plasma generation is abnormal, a likelihood the plasma is meeting one or more threshold performance standards, etc. The combined indication of performance may include a recommended corrective action.

At block 416, processing logic performs a corrective action in view of the combined indication of performance. The corrective action may include providing an alert to a user. The corrective action may include updating a process recipe. The corrective action may include adjusting an in-process operation to account for plasma quality. The corrective action may include aborting a processing procedure. The corrective action may include scheduling maintenance. The corrective action may include scheduling metrology or other additional investigations.

FIG. 4C is a flow diagram of a method 400C for performing a corrective action associated with plasma generation of a process chamber, according to some embodiments. At block 420, processing logic obtains a measurement of a calibrated feedback control device of a process chamber. The feedback control device may be part of a plasma generation system. The feedback control device may be an adjustable capacitor.

The feedback control device may be calibrated to determine a correspondence between a measurement of the feedback control device and a property of the plasma generation system. Calibrating the feedback control device may include generating a circuit diagram indicative of a plasma generation system. Calibrating the feedback control device may include generating a digital twin model based on the plasma generation system. Calibrating the feedback control device may include generating plasma at a variety of processing conditions to determine property values of components of the plasma generation system. Calibrating the feedback control device may include fitting property values of components of the plasma generation system. Calibrating the feedback control device may include fitting property values of components of the plasma generation system such that variation in properties known to be static/invariant to process conditions is minimized. Calibrating the feedback control device may utilize known constants of components of a model circuit, a digital twin, a plasma generation system, etc.

At block 422, processing logic determines a first indication of performance of a plasma generating apparatus of the process chamber based on the measurement of the calibrated feedback control device. Determining the first indication of performance may include providing the measurement of the calibrated feedback control device to a digital twin model. The first indication of performance may be related to power provided to the plasma. The first indication of performance may be related to resistance to electrical current provided by the plasma. The first indication of performance may further be based on a calibration value, e.g., a value of resistance of a bare plasma apparatus while plasma is not being generated.

Determining the first indication of performance may include determining properties of the plasma generating apparatus while under electrical load, but not generating plasma. For example, power may be supplied to a plasma generating apparatus, but the chamber may be evacuated to avoid plasma generation. Determining the first indication of performance may include comparing properties of the plasma generating apparatus while not generating plasma to properties of the plasma generating apparatus during a plasma processing operation.

At block 424, processing logic obtains, from a first sensor of the process chamber, a second indication of performance of the plasma generating apparatus. The second indication of performance may be or include data associated with emission of electromagnetic radiation from plasma. The second indication of performance may be collected by an electromagnetic sensor, an optical sensor, or the like. The second indication of performance may be based on measured intensity of emission. The second indication of performance may be based on measured intensity of emission at target wavelength bands, a target set of wavelengths, etc. The second indication of performance may include measured emission at wavelengths indicative of plasma generation.

In some embodiments, the second indication of performance includes a measure of reflected power. The second indication of performance may include a measure of reflected RF power supplied to the plasma generation apparatus. The reflected RF power may be the result of an impedance mismatch between components of the plasma generation system. High reflected RF power may indicate a high probability of a plasma generation fault.

At block 426, processing logic provides the first indication of performance of the plasma generating apparatus and the second indication of performance of the plasma generating apparatus to a plasma monitoring module. The plasma monitoring module may be or include a heuristic or rule-based model. The plasma monitoring module may be or include a statistical model. The plasma monitoring module may be or include a logistic model. The plasma monitoring module may be or include a joint probability model. The plasma monitoring module may be or include a trained machine learning model. In some embodiments, a combination of models may be utilized. For example, output of a logistic model may be utilized in training a machine learning model. In some embodiments, output of a logistic model may serve as a starting point for utilizing a machine learning model in determining one or more decision boundaries for recommending corrective actions associated with plasma generation.

At block 428, processing logic obtains, from the plasma monitoring module, a combined indication of performance of the plasma generating apparatus. The combined indication of performance may be based on the first and second indications of performance. The combined indication of performance may further be based on a third indication of performance of the plasma generating apparatus. The combined indication of performance may be based on a target number of indications of performance of the plasma generating apparatus. One or more of the indications of performance of the plasma generating apparatus may be provided by various sensors of the process chamber. The plasma monitoring module may be configured to receive inputs indicative of plasma quality and output predictions of plasma quality. The plasma monitoring module may be configured to output a likelihood of a plasma generation fault. The plasma monitoring module may be configured to output a recommendation of a corrective action associated with plasma generation. The combined indication of performance may be a joint probability of a plasma generation fault in view of the various indications provided to the plasma monitoring module. The combined indication of performance may be a probability of a plasma fault based on output of a trained machine learning model.

At block 430, processing logic performs a corrective action in view of the combined indication of performance of the plasma generating apparatus. The corrective action may be or include scheduling maintenance, updating a process recipe, altering an in-progress operation, aborting or halting an operation in progress, initiating plasma strike operations, providing an alert to a user, scheduling metrology or other investigations, etc.

Figure 5A:
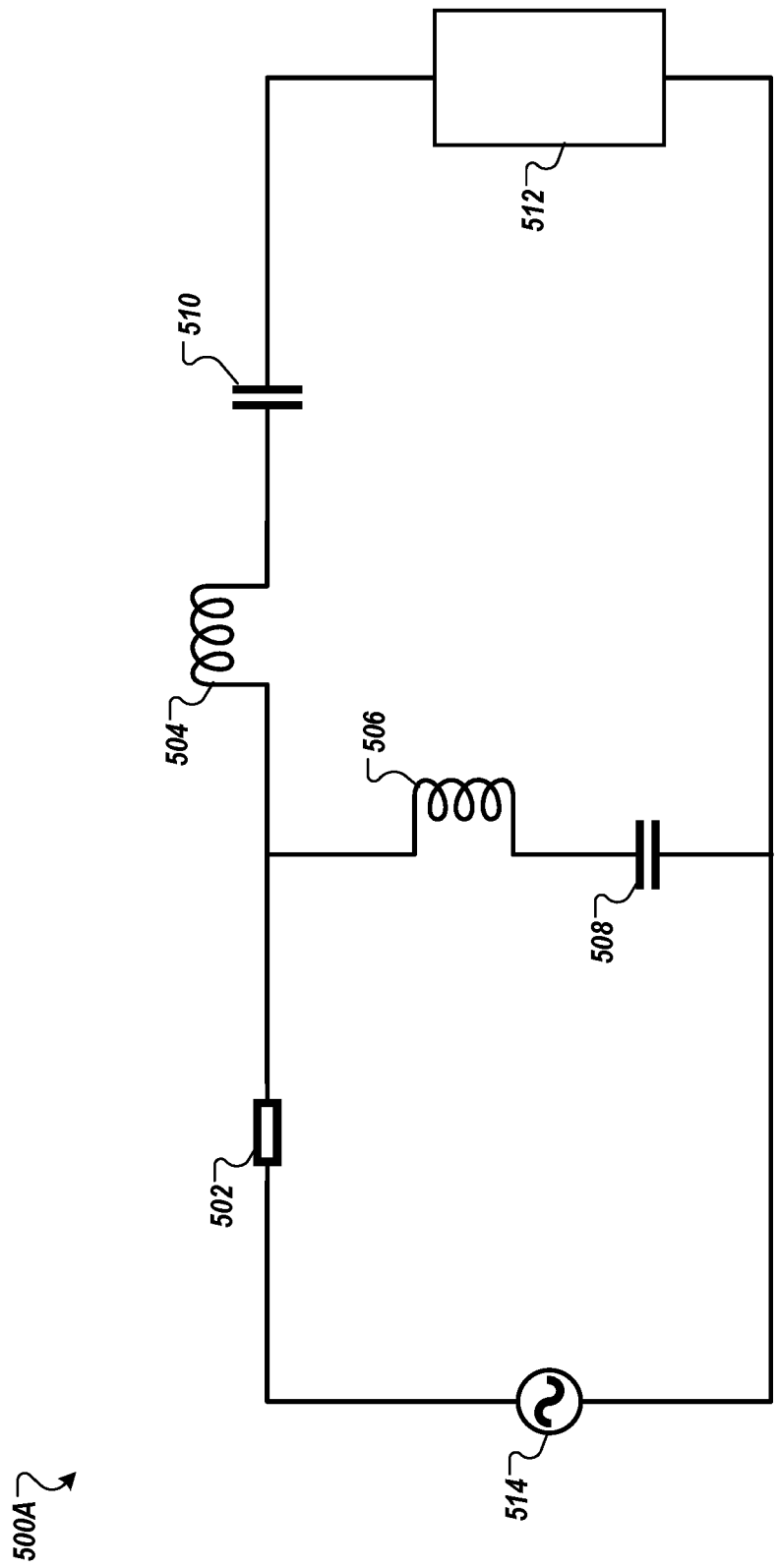
FIG. 5A is a block diagram depicting an example circuit diagram for building a digital twin model for a plasma processing system, according to some embodiments.

FIG. 5A depicts an example circuit diagram 500A for building a digital twin model for a plasma processing system, according to some embodiments. Circuit diagram 500A may approximate arrangement of components of a plasma generation system. Circuit diagram 500A may be a simplified representation of components of a plasma generation system. Circuit diagram 500A represents a particular plasma generation system. Circuit diagram 500A represents a model circuit representative of a plasma generation system. Arrangement of components in the diagram, overall shape of the circuit, electrical flow, etc., may be different than the example depicted in FIG. 5A.

Circuit diagram 500A includes static components, e.g., components that are not adjustable. Static components include resistor 502, first inductor 504, and second conductor 506. Components as depicted in the circuit diagram may include properties of more than one physical component, e.g., multiple resistors may be grouped and represented as resistor 502, inductances, capacitances, and/or inductances of additional components, wires, etc., may be included in the components of the circuit diagram 500A, etc.

Circuit diagram 500A includes dynamic components, e.g., components with properties that are adjustable. Dynamic components may be mechanically adjusted, e.g., adjusting a capacitance by adjusting a physical separation of conducting components. Dynamic components may have their electrical properties adjusted in other ways. Dynamic components may provide an indication of their properties, e.g., by a feedback system. Dynamic components of example circuit 500A include first capacitor 508 and second capacitor 510. One or more dynamic components of the plasma generation system may be included in a feedback system for plasma generation. First capacitor 508 and/or second capacitor 508 may be automatically adjusted. Capacitors may have their capacitance adjusted. Capacitors may be adjusted to maximize power delivered to the plasma.

Circuit diagram 500A further includes plasma generation apparatus 512 and A/C power source 514. Plasma generation apparatus 512 may include multiple types of components, multiple circuit parameters (e.g., resistance, inductance, etc.), may have multiple hidden variables included, etc. Any effects associated with the plasma generation apparatus may be abstracted in some digital twin models. In some embodiments, multiple models of increasing complexity may be built as knowledge of the plasma generation system improves. A digital twin may be generated in stages, with different levels of abstraction utilized in some stages of generating the digital twin model, etc. A/C power source 514 may provide RF power to plasma generation apparatus 512.

Exact property values of components included in a plasma generation system may vary. Property values may vary between systems. Property values may vary due to use of different components. Property values may vary even between nominally identical components (e.g., components sharing a manufacturer and part number). Property values may vary due to component aging, differences in manufacturing operations, differences within manufacturing tolerances, etc.

Direct measurement of properties of components included in circuit diagram 500A may be challenging. Properties may be power dependent, RF frequency dependent, or have other difficult to capture dependencies. Properties of components may be difficult to measure at RF frequencies. Properties of plasma generation apparatus 512 in particular may vary greatly with electrical conditions, plasma conditions, etc.

Circuit diagram 500A may be utilized in determining properties of one or more components of a plasma generation system. The plasma generation system may be utilized in generating plasma in a variety of process conditions. The plasma generation system may be utilized in generating plasma in a variety of plasma conditions. For example, various process gases, gas mixes, gas pressures and flow rates, etc., may be utilized. Nominal property values (e.g., resistances, capacitances, inductances, etc.) may be used as a starting point for generating a digital twin for the plasma generation system. Knowledge that some parameters are static may be leveraged in determining actual property values of components of the plasma generation system. Determining actual values of components in the plasma generation system may be considering to be calibrating a model circuit diagram.

The plasma generation system may automatically adjust one or more components. The plasma generation system may automatically adjust one or more components via a plasma generation feedback loop. The plasma generation system may automatically adjust one or more components to increase an amount of power delivered to a plasma. The plasma generation system may adjust capacitance of one or more capacitors. The plasma generation system may adjust capacitance of capacitors represented by capacitor 510. The plasma generation system may adjust capacitance of capacitors represented by capacitor 508. A digital twin model may receive as input nominal set values of capacitors 510 and 508. By monitoring some adjustable parameters of a plasma generation system, determination of properties of static components and curves of properties of dynamic components may be made. In some embodiments, properties of various components are selected that minimize deviation of property values of static components.

In some embodiments, additional complexity than is captured in a circuit diagram such as circuit diagram 500A may be included in a plasma generation system. For example, plasma generation apparatus 512 may include multiple components, may include effects from the plasma that are only observed when plasma is generated, etc. Additional calibration operations may be performed to determine these "hidden" parameters. For example, power may be delivered to plasma generation apparatus 512 under conditions where plasma is not generated. Power may be delivered to plasma generation apparatus 512 while the process chamber is evacuated. Power may be delivered to plasma generation apparatus when pressure within the chamber is below a threshold value. These procedures may indicate properties of the "bare" plasma generation apparatus 512, e.g., without the effect of providing energy to strike and/or sustain a plasma. In some embodiments, additional parameters may be systematically tested. Plasma generation apparatus 512 may abstract one or more adjustable components. Effects of adjusting these components may be understood by taking measurements (e.g., capacitances of calibrated capacitors 508 and 510) while intentionally adjusting these components. In some embodiments, plasma generation apparatus 512 may include one or more adjustable capacitors, e.g., for splitting current between multiple plasma generation coils. Splitting parameters may be altered and properties determined at various values of the splitting parameters. Properties may be determined at a variety of current ratios. A physical or empirical model may be generated describing the behavior of plasma generation apparatus 512 with respect to one or more hidden variables, such as current splitting ratio. In some embodiments, such operations may provide property values of the bare plasma generation apparatus at various input conditions of hidden variables. In some embodiments, a determination may be made of a difference between expected operation at a combination of hidden variables for a bare plasma generation apparatus and a measured operation including plasma generation. An influence of the plasma load on the system may be calculated by comparing a measured property (e.g., resistance, power consumption, etc.) to expected properties of the system. An influence of the plasma load on the system may be calculated by comparing a measured property to determined properties of the system without a plasma load, e.g., a bare system. An influence of the plasma load on the system may be determined based on a comparison between measured properties of the system in use and measured properties of the system when no plasma is generated.

In some embodiments, power delivered to a plasma is a useful indicator of plasma generation quality. Comparing properties of the plasma generation system without plasma present (e.g., the bare plasma generating apparatus) to properties of the plasma generation system in operation may provide information indicative of power delivery to the plasma. A difference between resistance exhibited by plasma generation apparatus 512 in operation and resistance exhibited by plasma generation apparatus 512 when no plasma is present (with similar or extrapolated other process conditions, hidden variables, etc.) may be indicative of plasma quality.

Operation of the digital twin model may include providing input to the digital twin model and receiving output indicative of plasma quality from the digital twin model. In some embodiments, measurements associated with a plasma generation feedback system may be provided as input to the digital twin model. Measurements of positions of one or more adjustable components may be provided as input to the digital twin model. measurements of capacitances of one or more adjustable capacitors may be provided as input to the digital twin model. Measurements of capacitors 508 and 510 may be provided to a digital twin model corresponding to circuit diagram 500A.

Indications of plasma generation may be provided as output of the digital twin model. Indication of plasma generation may include proxies for plasma generation, such as resistance attributed to the plasma generation apparatus, resistance attributed to the plasma itself (e.g., derived from the bare apparatus resistance), power delivered to the plasma, or the like. From a variety of values that could be provided by the digital twin model, an output that is found to be the best classifier of plasma generation quality may be provided as output by the digital twin model.

Indications of plasma generation related to measurements of the plasma generation system may be enhanced by further indications of plasma generation quality. Additional channels may provide increased ability to generate accurate predictions of plasma generation quality. One or more additional channels may be probed along with a digital twin model of the plasma generation system. A decision model may synthesize data from a number of input channels to make a determination on plasma generation quality.

Additional input channels may include any data indicative of plasma generation quality. Input channels may be selected that compliment the digital twin model, e.g., channels that depend on different assumptions than the digital twin model, channels that are likely to succeed in situations where the digital twin model may fail, etc. For example, utilizing a digital twin model of a plasma generation system including a feedback system may include an assumption that the feedback system is approximately enabling the maximum power delivery to the plasma. Power reflected by a plasma generation apparatus may indicate that this assumption is not valid, and may complement the digital twin model in plasma quality predictions.

Additional input channels may include spectral data from the plasma. Plasma may release radiation. Plasma may release radiation in one or more wavelength bands. Wavelength bands may be process gas dependent, pressure dependent, etc. A sensor (such as an optical sensor) may receive radiation from the plasma. The radiation received from the plasma may be integrated over relevant wavelength bands to provide information indicative of plasma generation.

FIGS. 5B-E depict various decision boundaries 500B-E associated with two input channels associated with plasma generation, according to some embodiments. Decision boundaries 500B-E depict regions of predictions based on two input channels as visually accessible examples, though more channels may be utilized in practice with corresponding multi-dimensional decision boundaries.

Figure 5C:
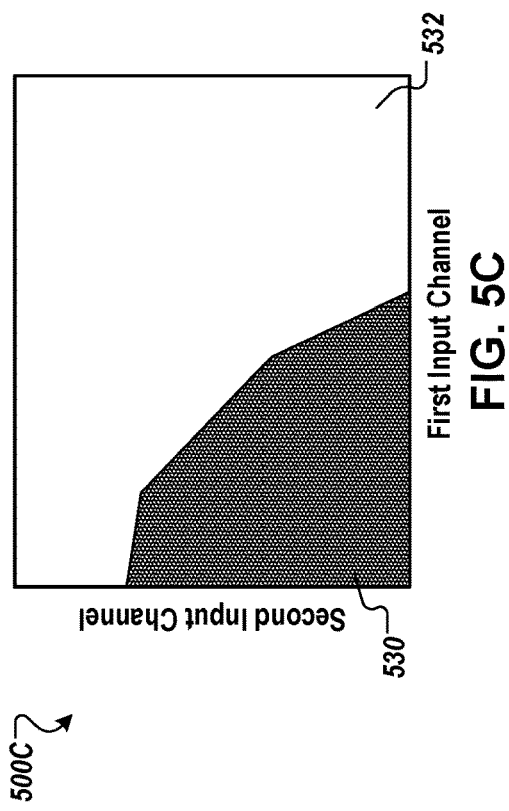
FIG. 5C depicts a dependent hard logic boundary, according to some embodiments.
Figure 5E:
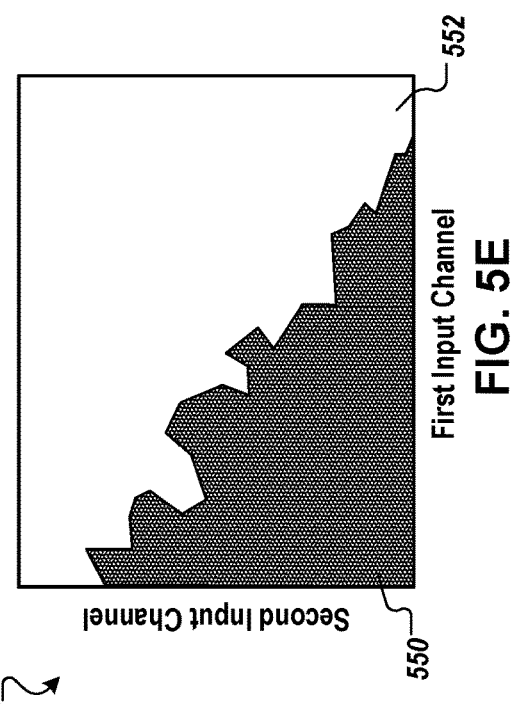
FIG. 5E depicts a decision boundary determined by a trained machine learning model, according to some embodiments.
Figure 5B:
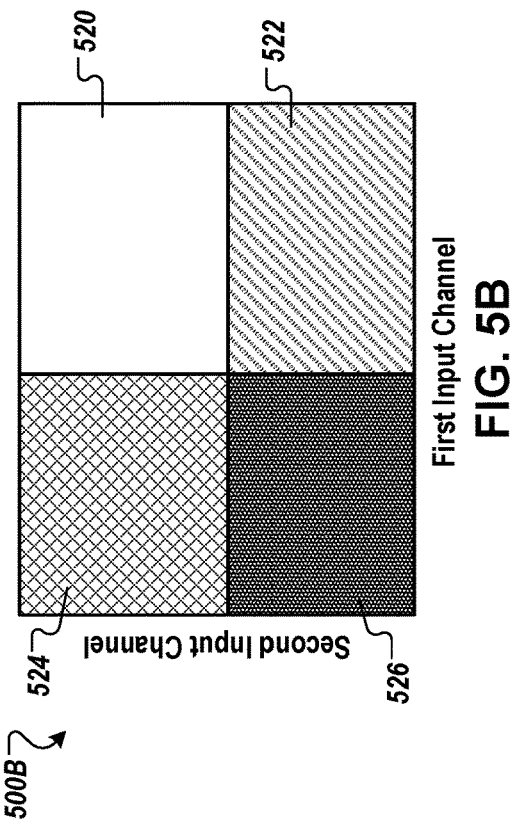
FIG. 5B depicts a logic decision boundary, according to some embodiments.

FIG. 5B depicts a logic decision boundary, according to some embodiments. In some cases, a decision boundary may be established for each input. For example, based on training data, a "best" decision boundary may be established for each input channel. The decision boundary for an input channel may be the decision boundary that provides the optimal decision accuracy (e.g., normal vs abnormal plasma generation boundary), provides a target false negative rate, provides a target false positive rate, or the like.

A logic decision boundary may provide a number of regions in decision space. A region that a measurement falls into may determine the actions of the prediction system. FIG. 5B includes four regions, regions 520-526. Depending upon target goals, measurements falling within one or more of the four regions may initiate corrective actions. In some embodiments, multiple regions may correspond to corrective actions. In some embodiments, one region may initiate different corrective actions than another region. Separations between regions may be determined by decision boundaries associated with the selected decision boundary for the relevant input channel. For example, region 520 may encompass measurements that do not indicate a plasma fault, and region 526 may encompass measurements where both input channels indicate a plasma fault. Measurements that fall within region 526 may initiate a first corrective action, such as aborting a manufacturing procedure. Measurements that fall within region 522 and/or 524 may initiate a second corrective action, such as scheduling metrology, scheduling maintenance, or the like. Measurements that fall within region 520 may not initiate a corrective action.

FIG. 5C depicts a dependent hard logic boundary, according to some embodiments. Decision boundary values in a first input channel may be considered to depend upon the value provided via the second input channel. The decision boundary separating regions 530 and 532 may not be single valued in either input channel. The decision boundary separating regions 530 and 532 may be single valued in a first input channel at a given value for the second input channel. Further regions may be defined to enable different combinations of input channel values to correspond to different corrective actions to be taken.

Figure 5D:
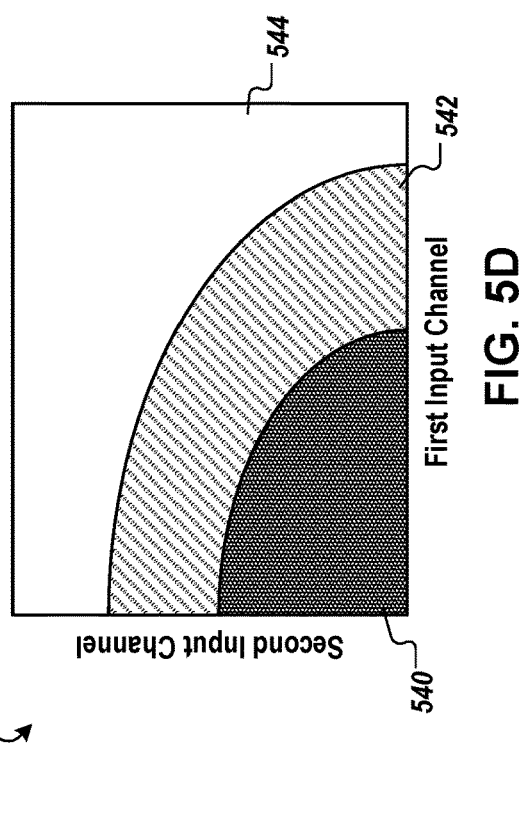
FIG. 5D depicts a logistic decision boundary, according to some embodiments.

FIG. 5D depicts a logistic decision boundary, according to some embodiments. A logistic function may be utilized in determining a decision boundary. The logistic function may be associated with a joint probability of a plasma generation fault given a first input value and a second input value. Region 544 may indicate near zero probability of a plasma generation fault. Region 540 may indicate a high probability of a plasma generation fault. Decision boundary 500D includes intermediate region 542. In intermediate region 542, probability of a fault may smoothly transition from a low probability near the border with region 544 to a high probability near the border with region 540. A target probability of fault may be used to determine further actions in a logistic decision boundary. Multiple decision boundaries may be incorporated, e.g., below a target probability of fault no corrective action may be taken, between a second target probability and a third target probability a low-impact corrective action may be taken, and above a fourth target probability a high-impact corrective action may be taken. Corrective actions may include scheduling maintenance, updating a process recipe, updating an equipment constant, adjusting a process in progress, updating a digital twin model and/or machine learning model, updating one or more decision boundaries, aborting a process in progress, etc.

FIG. 5E depicts a decision boundary 500E determined by a trained machine learning model, according to some embodiments. By providing input channel measurements as training input and classification data as training output, a machine learning model may generate a complicated decision boundary for performing corrective actions. The trained machine learning model may be a support vector machine, a neural network, or another type of machine learning model. In some embodiments, multiple decision boundaries may separate multiple regions. Each region may be associated with a different corrective action. Each decision boundary may be associated with a different probability of a plasma generation fault.

Figure 6:
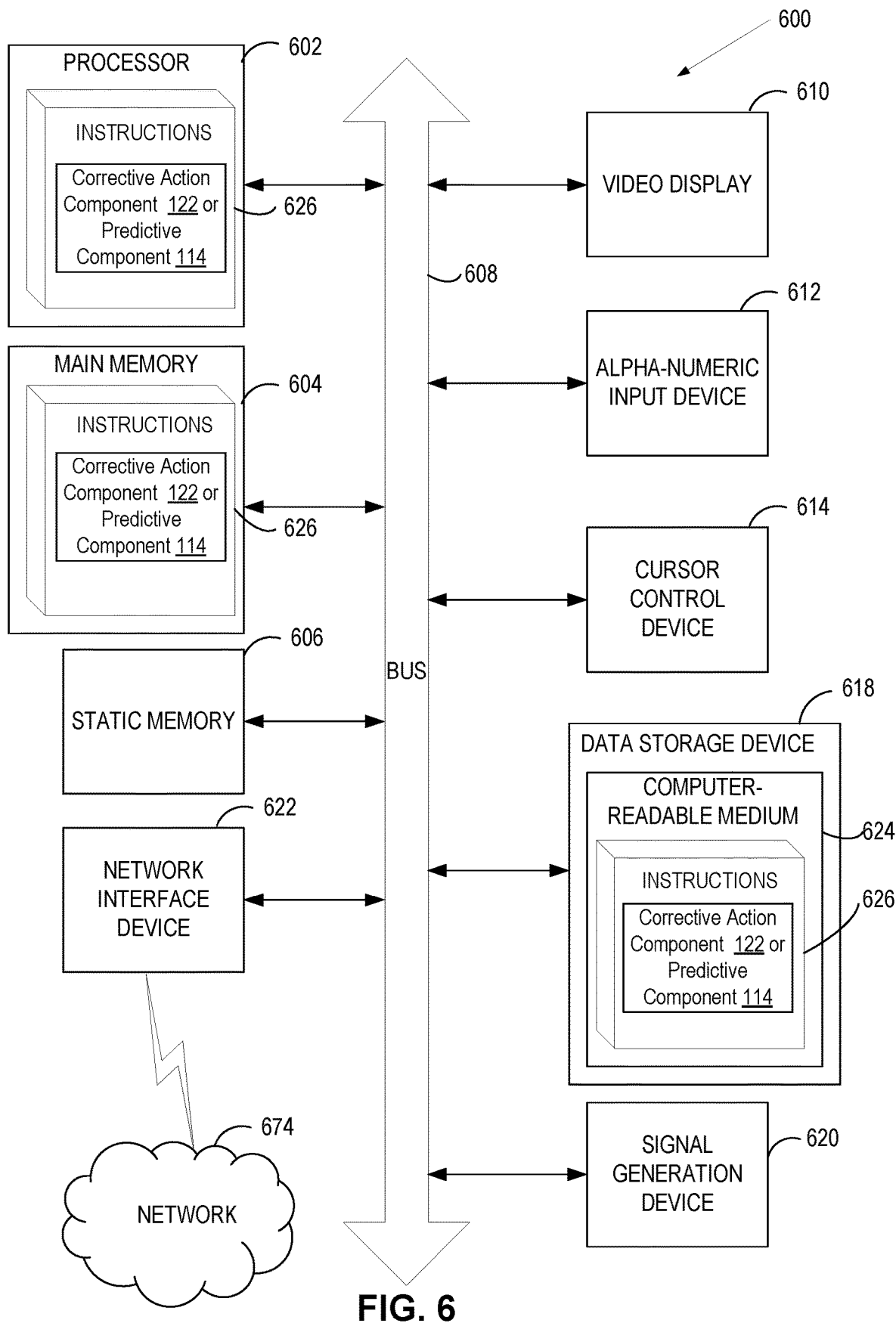
FIG. 6 is a block diagram illustrating a computer system, according to some embodiments.

FIG. 6 is a block diagram illustrating a computer system 600, according to some embodiments. In some embodiments, computer system 600 may be connected (e.g., via a network, such as a Local Area Network (LAN), an intranet, an extranet, or the Internet) to other computer systems. Computer system 600 may operate in the capacity of a server or a client computer in a client-server environment, or as a peer computer in a peer-to-peer or distributed network environment. Computer system 600 may be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 may include a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 618, which may communicate with each other via a bus 608.

Processing device 602 may be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 600 may further include a network interface device 622 (e.g., coupled to network 674). Computer system 600 also may include a video display unit 610 (e.g., an LCD), an alphanumeric input device 612 (e.g., a keyboard), a cursor control device 614 (e.g., a mouse), and a signal generation device 620.

In some embodiments, data storage device 618 may include a non-transitory computer-readable storage medium 624 (e.g., non-transitory machine-readable medium) on which may store instructions 626 encoding any one or more of the methods or functions described herein, including instructions encoding components of FIG. 1 (e.g., predictive component 114, corrective action component 122, model 190, etc.) and for implementing methods described herein.

Instructions 626 may also reside, completely or partially, within volatile memory 604 and/or within processing device 602 during execution thereof by computer system 600, hence, volatile memory 604 and processing device 602 may also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein may be implemented by discrete hardware components or may be integrated in the functionality of other hardware components such as ASICS, FPGAs, DSPs or similar devices. In addition, the methods, components, and features may be implemented by firmware modules or functional circuitry within hardware devices. Further, the methods, components, and features may be implemented in any combination of hardware devices and computer program components, or in computer programs.

Unless specifically stated otherwise, terms such as "receiving," "performing," "providing," "obtaining," "causing," "accessing," "determining," "adding," "using," "training," "reducing," "generating," "correcting," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and may not have an ordinal meaning according to their numerical designation.

Examples described herein also relate to an apparatus for performing the methods described herein. This apparatus may be specially constructed for performing the methods described herein, or it may include a general purpose computer system selectively programmed by a computer program stored in the computer system. Such a computer program may be stored in a computer-readable tangible storage medium.

The methods and illustrative examples described herein are not inherently related to any particular computer or other apparatus. Various general purpose systems may be used in accordance with the teachings described herein, or it may prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and embodiments, it will be recognized that the present disclosure is not limited to the examples and embodiments described. The scope of the disclosure should be determined with reference to the following claims, along with the full scope of equivalents to which the claims are entitled.

What is claimed is:

1. A method, comprising:
    obtaining, by a processing device, a measurement of a calibrated feedback control device of a process chamber;
    determining, by the processing device, a first indication of performance of a plasma generating apparatus of the process chamber based on the measurement of the calibrated feedback control device;
    obtaining, from a first sensor of the process chamber, a second indication of performance of the plasma generating apparatus;
    providing the first indication of performance of the plasma generating apparatus and the second indication of performance of the plasma generating apparatus to a plasma monitoring module;
    obtaining, from the plasma monitoring module, a combined indication of performance of the plasma generating apparatus; and
    performing, in view of the combined indication of performance of the plasma generating apparatus, a corrective action.

2. The method of claim 1, further comprising obtaining, from a second sensor of the process chamber, a third indication of performance of the plasma generating apparatus, wherein the combined indication of performance of the plasma generating apparatus is based on the first, second, and third indications of performance of the plasma generating apparatus.

3. The method of claim 1, wherein the first sensor comprises a sensor of electromagnetic radiation, and wherein the second indication of performance is based on a measured intensity of radiation at a target set of wavelengths indicative of plasma generation.

4. The method of claim 1, wherein the first sensor comprises a sensor of reflected power, and wherein the second indication of performance is based on electrical power reflected from the plasma generating apparatus.

5. The method of claim 1, wherein the plasma monitoring module comprises a logistic model, and wherein the combined indication of performance of the plasma generating apparatus comprises a joint probability of a plasma generation fault in view of the first indication of performance of the plasma generating apparatus and the second indication of performance of the plasma generating apparatus.

6. The method of claim 1, wherein the plasma monitoring module comprises a trained machine learning model, and wherein the trained machine learning model is configured to determine a likelihood of a plasma generation fault in view of the first indication of performance of the plasma generating apparatus and the second indication of performance of the plasma generating apparatus.

7. The method of claim 1, wherein calibrating the calibrated feedback control device comprises:
    generating a model circuit representative of a plasma generation system of the process chamber, wherein the plasma generation system includes a feedback control device;
    generating plasma using the plasma generating apparatus of the plasma generation system in a plurality of plasma conditions; and
    utilizing known constants of the model circuit to calibrate the feedback control device.

8. The method of claim 1, wherein determining the first indication of performance of the plasma generating apparatus of the process chamber comprises:
    determining first properties of the plasma generating apparatus while under electrical load, and not generating plasma; and
    comparing the first properties of the plasma generating apparatus while not generating plasma to second properties of the plasma generating apparatus during a plasma processing operation.

9. The method of claim 1, wherein the calibrated feedback control device comprises an adjustable capacitor.

10. The method of claim 1, wherein the corrective action comprises one or more of:
    updating a process recipe;
    halting a process operation in progress;
    initiating plasma strike operations;
    scheduling maintenance; or
    providing an alert to a user.

11. A method, comprising:
    providing, to a trained machine learning model, a first indication of performance of a plasma generating apparatus of a process chamber, wherein the first indication of performance of the plasma generating apparatus is indicative of electrical power delivered to a plasma of the plasma generating apparatus;

providing, to the trained machine learning model, a second indication of performance of the plasma generating apparatus;

receiving, from the trained machine learning model, a combined indication of performance of the plasma generating apparatus, based on the first indication of performance and the second indication of performance; and performing a corrective action in view of the combined indication of performance.

12. The method of claim 11, wherein the second indication of performance of the plasma generating apparatus comprises an indication of measured plasma emission by an optical sensor.

13. The method of claim 11, further comprising:
providing a plurality of first indications of performance of the plasma generating apparatus to a machine learning model as training input;
providing a plurality of second indications of performance of the plasma generating apparatus to the machine learning model as training input;
providing a plurality of plasma generating apparatus performance classification data to the machine learning model as target output; and
training the machine learning model to generate the trained machine learning model based on the training input and target output.

14. The method of claim 11, wherein the combined indication of performance of the plasma generating apparatus comprises a likelihood that the plasma generating apparatus is meeting threshold performance standards.

15. The method of claim 11, wherein generating the first indication of performance of the plasma generating apparatus comprises:
generating a digital twin of the plasma generating apparatus;
providing measured plasma generation feedback data to the digital twin;
receiving output from the digital twin based on the measured plasma generation feedback data; and
comparing output from the digital twin to calibration data, wherein the first indication of performance of the plasma generating apparatus is based on comparing output from the digital twin to calibration data.

16. A non-transitory machine-readable storage medium storing instructions which, when executed, cause a processing device to perform operations comprising:
obtaining a measurement of a calibrated feedback control device of a process chamber;
determining a first indication of performance of a plasma generating apparatus of the process chamber based on the measurement of the calibrated feedback control device;
obtaining, from a first sensor of the process chamber, a second indication of performance of the plasma generating apparatus;
providing the first indication of performance of the plasma generating apparatus and the second indication of performance of the plasma generating apparatus to a plasma monitoring module;
obtaining, from the plasma monitoring module, a combined indication of performance of the plasma generating apparatus; and
performing, in view of the combined indication of performance of the plasma generating apparatus, a corrective action.

17. The non-transitory machine-readable storage medium of claim 16, wherein the operations further comprise obtaining, from a second sensor of the process chamber, a third indication of performance of the plasma generating apparatus, wherein the combined indication of performance of the plasma generating apparatus is based on the first, second, and third indications of performance of the plasma generating apparatus.

18. The non-transitory machine-readable storage medium of claim 16, wherein the first sensor comprises a sensor of electromagnetic radiation, and wherein the second indication of performance is based on a measured intensity of radiation at a target set of wavelengths indicative of plasma generation.

19. The non-transitory machine-readable storage medium of claim 16, wherein calibrating the calibrated feedback control device comprises:
generating a model circuit representative of a plasma generation system of the process chamber, wherein the plasma generation system includes a feedback control device;
generating plasma using the plasma generating apparatus of the plasma generation system in a plurality of plasma conditions; and
utilizing known constants of the model circuit to calibrate the feedback control device.

20. The non-transitory machine-readable storage medium of claim 16, wherein determining the first indication of performance of the plasma generating apparatus of the process chamber comprises:
determining first properties of the plasma generating apparatus while under electrical load, and not generating plasma; and
comparing the first properties of the plasma generating apparatus while not generating plasma to second properties of the plasma generating apparatus during a plasma processing operation.

* * * * *